(12) United States Patent
Higaki et al.

(10) Patent No.: US 9,322,853 B2
(45) Date of Patent: Apr. 26, 2016

(54) ANTENNA DEVICE AND WIRELESS COMMUNICATION APPARATUS

(71) Applicant: KABUSHIKI KAISHA TOSHIBA, Minato-ku, Tokyo (JP)

(72) Inventors: Makoto Higaki, Tokyo (JP); Shuichi Obayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/317,625

(22) Filed: Jun. 27, 2014

(65) Prior Publication Data

US 2015/0031420 A1    Jan. 29, 2015

(30) Foreign Application Priority Data

Jul. 26, 2013   (JP) .................................. 2013-156057

(51) Int. Cl.
*H04B 1/40* (2015.01)
*G01R 21/00* (2006.01)
*H04B 1/04* (2006.01)
*H04B 1/18* (2006.01)

(52) U.S. Cl.
CPC .............. *G01R 21/00* (2013.01); *H04B 1/0458* (2013.01); *H04B 1/18* (2013.01)

(58) Field of Classification Search
CPC ........ H04M 1/02; H04B 1/40; G06K 19/0717
USPC ........... 455/73, 84, 522, 572, 575.1; 343/703, 343/861
See application file for complete search history.

(56) References Cited

U.S. PATENT DOCUMENTS

| 2005/0184922 | A1 | 8/2005 | Ida et al. |
| 2006/0160501 | A1 | 7/2006 | Mendolia et al. |
| 2007/0285326 | A1 | 12/2007 | McKinzie |
| 2013/0002511 | A1 | 1/2013 | Higaki et al. |
| 2013/0095775 | A1* | 4/2013 | Kim .................. H04B 1/18 455/84 |

FOREIGN PATENT DOCUMENTS

| JP | 3075097 | 6/2000 |
| JP | 2003-332934 | 11/2003 |
| JP | 2006-340028 | 12/2006 |
| JP | 2013-16949 | 1/2013 |

OTHER PUBLICATIONS

Notification of the First Office Action issued by the State Intellectual Property Office of the People's Republic of China on Jan. 25, 2016, for Chinese Patent Application No. 201410335044.X, and English-language translation thereof.

\* cited by examiner

*Primary Examiner* — Sam Bhattacharya
(74) *Attorney, Agent, or Firm* — Finnegan, Henderson, Farabow, Garrett & Dunner, LLP

(57) ABSTRACT

An antenna device of an embodiment includes: an antenna; a variable impedance matching circuit that is connected to the antenna; a probe that receives power from the antenna; a power detector that is connected to the probe; a control circuit controlling the variable impedance matching circuit based on a value of power measured by the power detector; a first arithmetic circuit calculating a variation in the value of power measured by the power detector; a comparator circuit that compares the variation with a predetermined numerical value range; and a starter circuit that activates the control circuit based on a result of the comparison performed by the comparator circuit.

19 Claims, 21 Drawing Sheets

ANTENNA DEVICE AND WIRELESS COMMUNICATION APPARATUS

CROSS-REFERENCE TO RELATED APPLICATION

This application is based upon and claims the benefit of priority from Japanese Patent Application No. 2013-156057, filed on Jul. 26, 2013, the entire contents of which are incorporated herein by reference.

FIELD

Embodiments described herein relate generally to an antenna device and a wireless communication apparatus.

BACKGROUND

In a wireless communication apparatus such as a portable telephone device, power loss is caused by mismatching between an input impedance of the antenna and an output impedance of the power amplifier. There is a method for reducing the power loss. According to the method, a variable impedance matching circuit is provided between the antenna and a radio, mismatching is detected by monitoring power being released from the antenna, and matching is automatically achieved between the input impedance of the antenna and the output impedance of the radio.

Meanwhile, there are cases where TPC (Transmission Power Control) is performed to maintain a preferred communication state by making the gain of the power amplifier variable, and changing transmission power in accordance with variations in the communication state. Where TPC is performed, example causes of variations in the power released from the antenna include the following three factors.
(1) A change in the state of the variable impedance matching circuit (hereinafter also referred to simply as a state change).
(2) A change in the gain of the power amplifier (hereinafter also referred to simply as a gain change).
(3) A change in the environment surrounding the wireless communication apparatus (hereinafter also referred to simply as an environmental change).

Where TPC is performed, it is difficult to determine which change factor has caused a variation in the power released from the antenna. If a state change or an environmental change is not distinguished from a gain change in a control operation, power consumption might increase due to an unnecessary matching operation, or an incorrect operation might be performed in automatic impedance matching.

DETAILED DESCRIPTION

Figure 1:
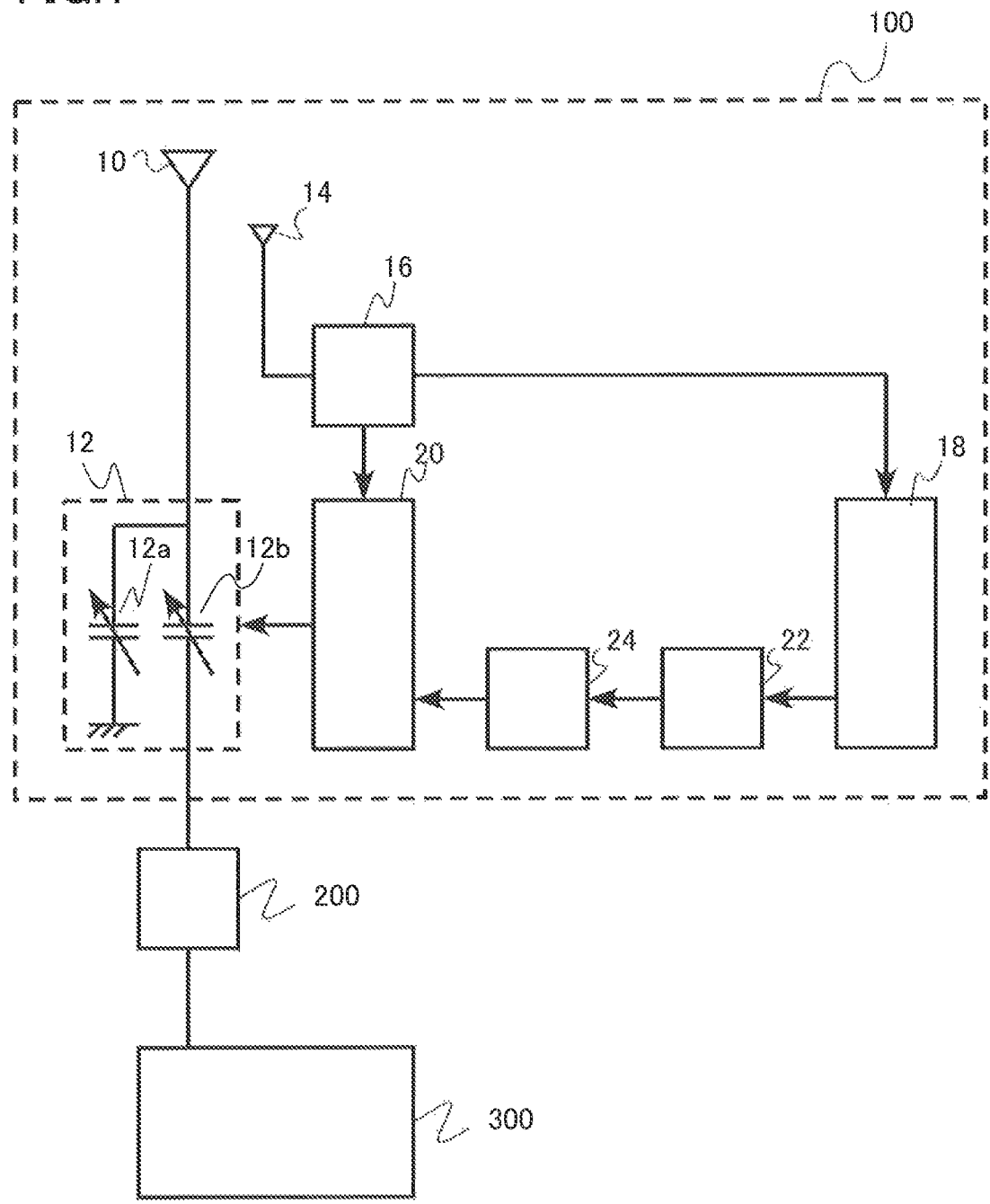
FIG. 1 is a schematic diagram showing the structures of an antenna device and a wireless communication apparatus of a first embodiment.

An antenna device of an embodiment includes: an antenna; a variable impedance matching circuit that is connected to the antenna; a probe that receives power from the antenna; a power detector that is connected to the probe; a control circuit controlling the variable impedance matching circuit based on a value of power measured by the power detector; a first arithmetic circuit calculating a variation in the value of power measured by the power detector; a comparator circuit that compares the variation with a predetermined numerical value range; and a starter circuit that activates the control circuit based on a result of the comparison performed by the comparator circuit.

The following is a description of embodiments, with reference to the accompanying drawings. In the drawings, the same or similar components are denoted by the same or similar reference numerals.

In the embodiments, a circuit (circuit A) being connected to another circuit (circuit B) means that a signal is transmitted from circuit A having a particular function to circuit B having another function, but does not necessarily mean that circuit A and circuit B are physically connected to each other.

(First Embodiment)
An antenna device of this embodiment includes: an antenna; a variable impedance matching circuit that is connected to the antenna; a probe that receives power from the antenna; a power detector that is connected to the probe; a control circuit that is connected to the power detector, and controls the variable impedance matching circuit based on a value of power measured by the power detector; a first arithmetic circuit that is connected to the power detector, and calculates a variation in the value of power measured by the power detector; a comparator circuit that compares the variation with a predetermined value; and a starter circuit that activates the control circuit based on a result of the comparison performed by the comparator circuit.

A wireless communication apparatus of this embodiment includes: the antenna device; a radio that is connected to the opposite side of the variable impedance matching circuit from the antenna; and a power amplifier that is connected between the variable impedance matching circuit and the radio.

FIG. 1 is a schematic diagram showing the structures of the antenna device and the wireless communication apparatus of this embodiment. The wireless communication apparatus of this embodiment includes an antenna device 100, a power amplifier 200, and a radio 300. The radio 300 is a transceiver, for example. In this manner, the antenna device 100, the power amplifier 200 connected to the antenna device 100, and the radio 300 constitute the wireless communication apparatus. The wireless communication apparatus is a portable telephone device, for example.

The antenna device 100 includes an antenna 10, a variable impedance matching circuit 12, a probe 14, a power detector 16, a first arithmetic circuit 18, a control circuit 20, a comparator circuit 22, and a starter circuit 24.

The antenna 10 is a conductor. The antenna 10 transmits a signal that is transferred from the radio 300. The antenna 10 is an inverted L antenna that has its open end at the end on the opposite side from its feeding point, for example. Using an inverted L antenna is desirable in reducing the size and simplifying the design of the wireless communication apparatus including the antenna device 100, but the shape of the antenna 10 is not limited to an inverted L. The antenna 10 can be an inverted F antenna.

The variable impedance matching circuit 12 is connected to the feeding point of the antenna 10. The variable impedance matching circuit 12 matches the input impedance of the antenna 10 and the output impedance of the radio 300 by performing impedance adjustment.

The variable impedance matching circuit 12 is formed with two variable capacitances 12a and 12b, for example. There are no particular restrictions on the number of variable capacitances to be used and the circuit connection topology. Other than variable capacitances, variable inductors or switches may be used as variable impedance elements. Functions of those variable elements can be realized by semiconductors, MEMS (Micro Electro Mechanical Systems), or the like. Furthermore, so as to design a variable impedance range, inductors or capacitors that have element values fixed may be used.

The probe 14 is a differential probe that is in the form of a dipole formed with two symmetrical conductors, for example. The probe 14 is located near the edge of the antenna 10, and receives power from the antenna 10. So as to suppress noise generated from an electronic component or the like of the wireless communication apparatus to which the antenna device 100 is connected, the probe 14 is preferably a differential probe. Alternatively, it is possible to use a probe in the form of a monopole, a loop, or the like.

The power detector 16 is connected to the probe 14. The power detector 16 measures the value of power received by the probe 14. The power detector 16 has a function to output a DC voltage, a DC current, or binary data corresponding to the intensity of a power signal received by the probe 14.

The first arithmetic circuit 18 is connected to the power detector 16. The first arithmetic circuit 18 calculates variations in the value of power detected by the power detector 16. For example, the first arithmetic circuit 18 calculates a variation in the value of power at predetermined time intervals. The first arithmetic circuit 18 is formed with a combination of hardware such as a microcomputer and software stored in a semiconductor memory, for example. Alternatively, the first arithmetic circuit 18 may be formed with hardware such as an analog circuit or a digital circuit.

The control circuit 20 is connected between the first arithmetic circuit 18 and the variable impedance matching circuit 12. Based on the value of power detected by the power detector 16, the control circuit 20 controls the variable impedance matching circuit 12 so as to match the input impedance of the antenna 10 and the output impedance of the radio 300. The control circuit 20 is realized by a combination of hardware such as a microcomputer and software stored in a semiconductor memory, for example. Alternatively, the control circuit 20 may be formed with hardware such as an analog circuit or a digital circuit.

The control circuit 20 controls the variable impedance matching circuit 12 so that the value of power to be detected by the power detector 16 will be maximized, for example. Where the power to be emitted from the antenna 10 is maximized, the impedance matching can be regarded as best. Specifically, the control circuit 20 changes reactance values of the variable capacitances 12a and 12b, for example.

The comparator circuit 22 is connected between the first arithmetic circuit 18 and the control circuit 20. The comparator circuit 22 compares a variation in the value of power of the antenna 10 calculated by the first arithmetic circuit 18 with a predetermined numerical value range. The comparator circuit 22 is realized by a combination of hardware such as a microcomputer and software stored in a semiconductor memory, for example. Alternatively, the comparator circuit 22 may be formed with hardware such as an analog circuit or a digital circuit.

Here, the predetermined numerical value range is the value to be used for determining whether a variation in the power of the antenna 10 is caused by a variation in the gain of the power amplifier 200 (a gain change), whether a variation in the power of the antenna 10 is caused by a change in the state of the variable impedance matching circuit 12 (a state change), or whether a variation in the power of the antenna 10 is caused by a change in the ambient environment of the wireless communication apparatus (an environmental change). For example, the predetermined numerical value range is a range based on the value of power that serves as a unit of a power increase/decrease caused by the power amplifier 200. The predetermined numerical value range is not limited to a single numerical value range, and may include two or more numerical value ranges.

The starter circuit 24 is connected between the comparator circuit 22 and the control circuit 20. The starter circuit 24 activates the control circuit 20 based on a result of the comparison performed by the comparator circuit 22. The starter circuit 24 is realized by a combination of hardware such as a microcomputer and software stored in a semiconductor memory, for example. Alternatively, the starter circuit 24 may be formed with hardware such as an analog circuit or a digital circuit. Functions of the first arithmetic circuit 18, the control circuit 20, the comparator circuit 22 and the starter circuit 24 may be realized by a single microcomputer.

In a case where the comparator circuit 22 determines that a variation in the value of power does not match a predetermined numerical value range within which the variation can be determined to have been caused by a gain change, for example, the control circuit 20 is activated, and an impedance matching operation is started. In a case where the comparator circuit 22 determines that a variation in the value of power matches the predetermined numerical value range within which the variation can be determined to have been caused by a gain change, for example, the control circuit 20 is not activated, and any impedance matching operation is not started.

The radio 300 is connected to the opposite side of the variable impedance matching circuit 12 from the antenna 10. The power amplifier 200 is connected between the variable impedance matching circuit 12 and the radio 300.

The radio 300 is a transmitter, for example. The power amplifier 200 is a variable gain amplifier, for example.

In a case where the power amplifier 200 is a variable gain amplifier, the power that is output from the radio 300 can be increased or decreased in a stepwise manner. The minimum gain variable width of the power amplifier 200 is represented by ΔG (dB). The minimum gain variable width ΔG is a value of power that serves as a unit of a power increase/decrease caused by the power amplifier 200. For example, when the power amplifier 200 decreases the power transmitted to the antenna 10 by ΔG, the power emitted by the antenna 10 also decreases by ΔG.

The functions and effects of the antenna device and the wireless communication apparatus of this embodiment are now described below.

First, control of the variable impedance matching circuit 12 by the control circuit 20 is described.

The probe 14 detects a change in the charge amount at the open end of the inverted L antenna 10 as electric power through capacitance coupling. The power detector 15 then outputs the DC voltage, the DC current, or the binary data corresponding to the intensity of a power signal measured by the probe 14, to the control circuit 20 and the first arithmetic circuit 18.

Based on the value of the power measured by the power detector 16, the control circuit 20 transmits a control signal to the variable impedance matching circuit 12 so that the detected power to be sent from the power detector 16 will be maximized.

When the matching between the input impedance of the antenna 10 and the output impedance of the radio 300 becomes better, the power to be fed to the antenna 10 becomes larger. As the power fed from the feeding point of the antenna 10 becomes larger, the current in the antenna 10 becomes higher. Accordingly, the charge amount at the open end on the opposite side of the antenna 10 from the feeding point becomes larger. As a result, the power (the power signal) to be received by the probe 14 also becomes larger by virtue of the capacitance coupling with the probe 14 located near the end portion that is the open end. In view of this, the matching state of the antenna 10 is improved by performing control to increase the power to be detected by the power detector 16. That is, impedance matching is realized.

In this embodiment, the control circuit 20 controls the variable impedance matching circuit 12 based on the power received by the probe 14, to realize automatic impedance matching. The control circuit 20 controls the variable impedance matching circuit 12, so as to maximize the detected power to be sent from the power detector 16.

Specifically, the control circuit 20 outputs an instruction based on the value of power sent from the power detector 16 as a control signal to the variable impedance matching circuit 12. In accordance with this signal, the impedance values of the variable impedance elements in the variable impedance matching circuit 12 are controlled. For example, in a case where the variable impedance elements are variable capacitances, the reactance values of the variable capacitances are changed.

For example, the impedance values of the variable elements may be changed randomly, and the control signal that is output when the value of power detected by the power detector 16 becomes largest may be stored. Alternatively, all the possible combinations of states to be applied to the variable elements may be set, and the control signal that is output when the value of the detected power becomes largest may be stored. The control method implemented in the control circuit 20 may be any control method such as the above described simple method or a known method, as long as the value of power to be detected by the power detector 16 can be maximized.

Figure 2:
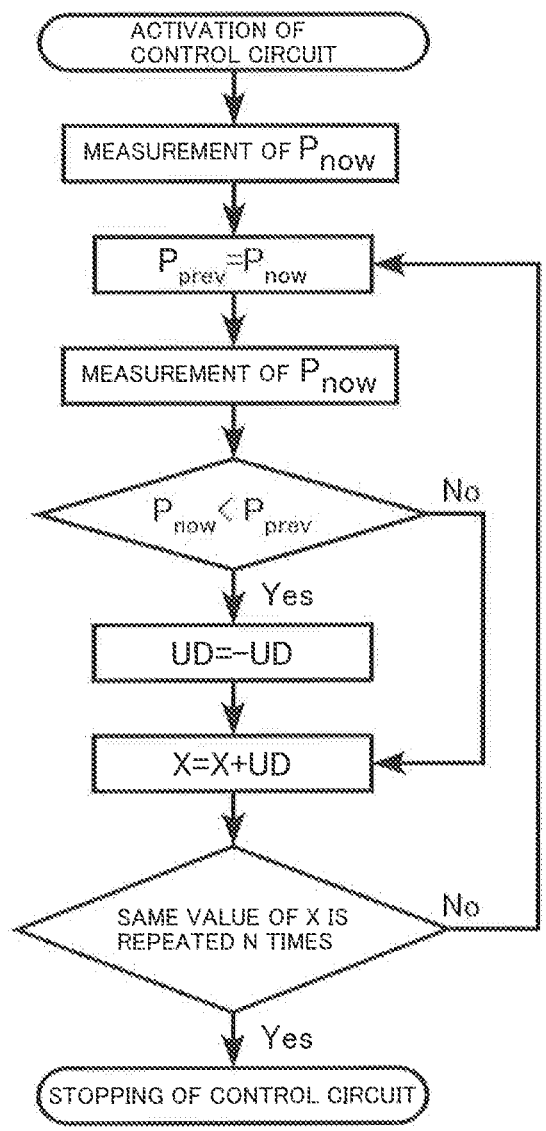
FIG. 2 is a flowchart showing an impedance matching operation of the first embodiment.
Figure 3:
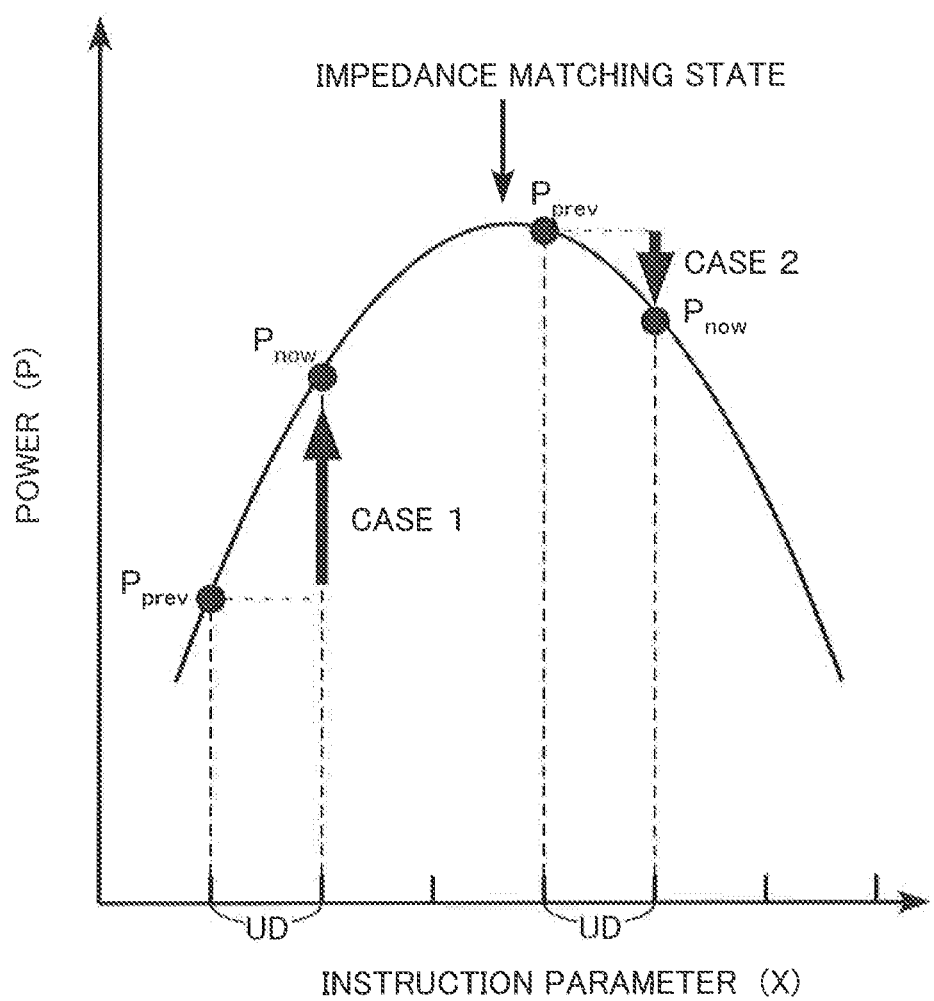
FIG. 3 is a diagram for explaining an impedance matching operation of the first embodiment.

FIG. 2 is a flowchart showing an example of an impedance matching operation according to this embodiment. FIG. 3 is a diagram for explaining an impedance matching operation according to this embodiment.

In this example, while the power measured by the power detector 16 stays in the same direction of change, the control circuit 20 keeps changing the impedance of the variable impedance matching circuit 12 in one direction. When the direction of change in the power measured by the power detector 16 switches to the opposite direction, the control circuit 20 changes the impedance of the variable impedance matching circuit 12 in the opposite direction. In a case where the direction of change in impedance is switched a predetermined number of times, the detected power is determined to be maximized, and the operation of the control circuit 20 is stopped.

Specifically, the control circuit 20 is first activated, and an automatic impedance matching operation by the variable impedance matching circuit 12 is started. The current value ($P_{now}$) of power is measured by the power detector 16, and the measurement result is input to the control circuit 20. The current value ($P_{now}$) of power is then assigned to the previous value ($P_{prev}$) of power. The current value ($P_{now}$) of power is again measured by the power detector 16, and the measurement result is input to the control circuit 20.

The current value ($P_{now}$) is compared with the previous value ($P_{prev}$), to determine which value is larger. In this manner, an increase/decrease in the power released from the antenna 10 is determined.

If the current value ($P_{now}$) is larger than the previous value ($P_{prev}$) (case 1 in FIG. 3), "X+UD" is assigned to X. If the current value ($P_{now}$) is smaller than the previous value ($P_{prev}$) (case 2 in FIG. 3), −UD with the opposite sign is assigned to UD, and "X+UD" is then assigned to X.

Here, X represents the instruction parameter for indicating the impedance value of the variable impedance elements in the variable impedance matching circuit 12, and UD represents the minimum unit of the instruction parameter. As X is changed with UD as a unit, the impedance of the variable impedance matching circuit varies, and the power to be emitted from the antenna 10 also varies with the state of impedance matching. The instruction parameter is the reactance value of the variable capacitances 12a and 12b, for example.

If the current value ($P_{now}$) is larger than the previous value ($P_{prev}$) (case 1 in FIG. 3), "X+UD" is assigned to X as described above, so as to maintain the direction of change in X in one direction. With this, the power to be emitted from the antenna 10 increases. If the current value ($P_{now}$) is smaller than the previous value ($P_{prev}$) (case 2 in FIG. 3), on the other hand, −UD with the opposite sign is assigned to UD, and "X+UD" is then assigned to X, so as to switch the direction of change in X to the opposite direction. With this, the value of X varies in the opposite di reaction, and the power to be emitted from the antenna 10 increases. In this manner, the variable impedance matching circuit 12 is controlled so as to maximize the power to be emitted from the antenna 10.

In a case where the same value of X is repeated N times (N being a predetermined natural number), the power to be emitted from the antenna 10 is determined to be maximized. That is, it is determined that impedance matching is achieved, and the operation of the control circuit 20 is stopped. In this case, the number of times the direction of change in impedance is switched is measured by counting the number of times the same value of X is repeated.

Figure 4:
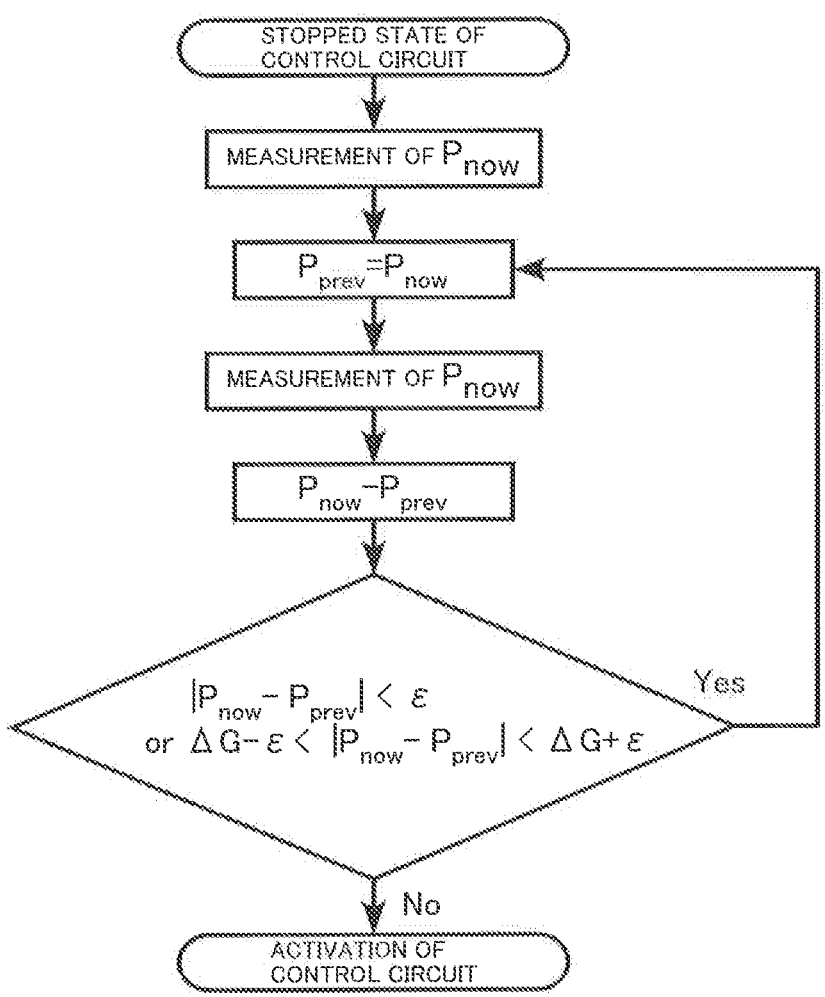
FIG. 4 is a flowchart showing a control circuit activating operation of the first embodiment.
Figure 5:
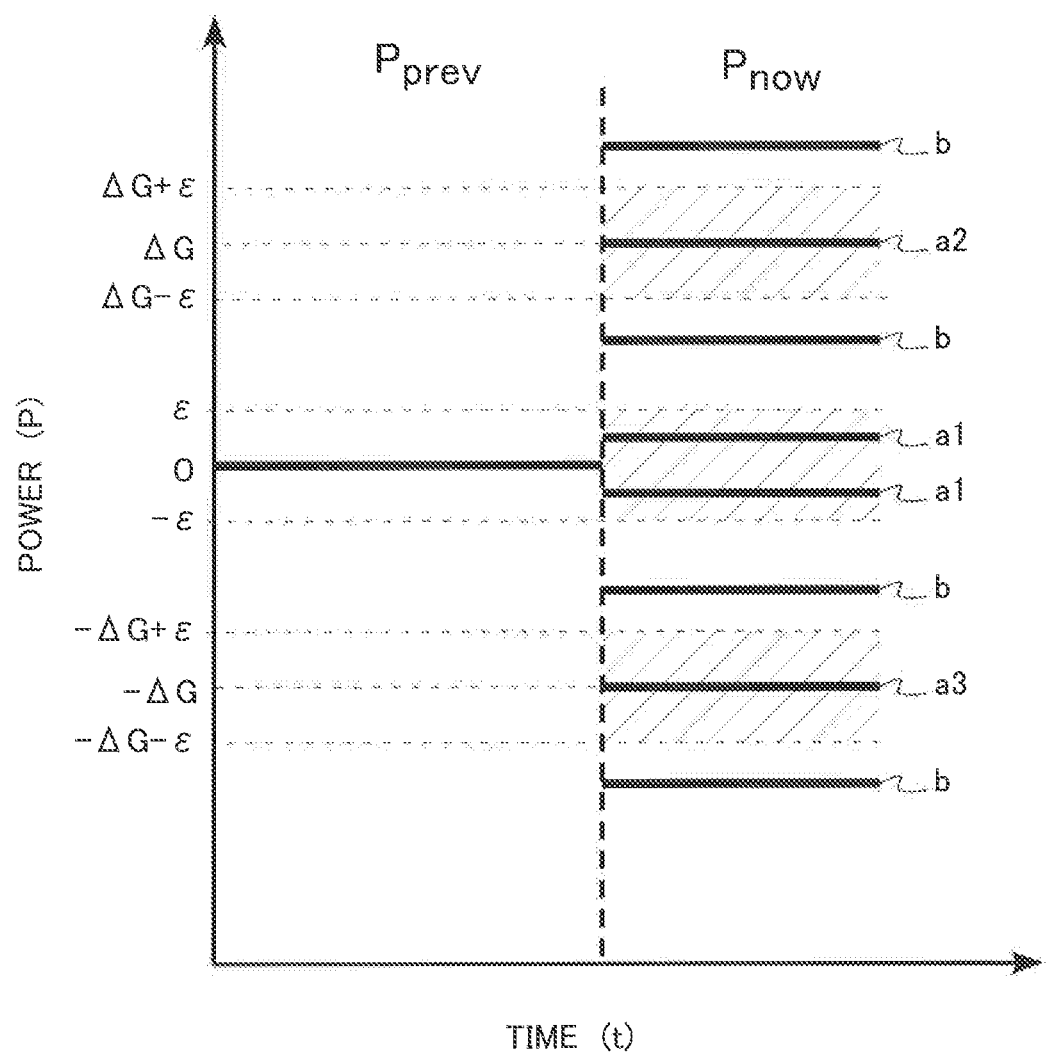
FIG. 5 is a diagram for explaining a control circuit activating operation of the first embodiment.

Next, an operation related to activation of the control circuit 20 is described. FIG. 4 is a flowchart showing an example of a control circuit activating operation according to this embodiment. FIG. 5 is a diagram for explaining a control circuit activating operation according to this embodiment.

In a steady state, the control circuit 20 is not operating. Even in a state where the control circuit 20 is not operating, power measurement is performed by the power detector 16. First, the current value ($P_{now}$) of power is measured by the power detector 16, and the measurement result is input to the first arithmetic circuit 18. The current value ($P_{now}$) of power is then assigned to the previous value ($P_{prev}$) of power. The current value ($P_{now}$) of power is again measured by the power detector 16, and the measurement result is input to the first arithmetic circuit 18.

A variation in the value of power, or a difference ($P_{now}-P_{prev}$) between the current value ($P_{now}$) of power and the previous value ($P_{prev}$) of power, is calculated. The variation ($P_{now}-P_{prev}$) in the value of power is calculated by the first arithmetic circuit 18. The variation ($P_{now}-P_{prev}$) in the value of power is expressed by the absolute value thereof, for example.

The absolute value of the variation ($P_{now}-P_{prev}$) in the value of power is then compared with the predetermined numerical value range. This comparison is performed by the comparator circuit 22. A check is made to determine whether the absolute value of the variation ($P_{now}-P_{prev}$) in the value of power is not larger than a predetermined threshold value ($\epsilon$), for example. Also, a check is made to determine whether the absolute value of the variation is larger than "$\Delta G-\epsilon$" but smaller than "$\Delta G+\epsilon$", for example. Here, $\Delta G$ represents the minimum gain variable width $\Delta G$ (dB) of the power amplifier 200.

The power communication device of this embodiment includes the power amplifier 200, to perform TPC (Transmission Power Control) to control transmission power in accordance with variations in the communication state. Therefore, it is preferable to determine whether a variation in the value of power detected by the power detector 16 is caused by impedance mismatching due to a state change or an environmental change, or is caused by the power amplifier 200 (a gain change).

In this embodiment, as shown in FIG. 5, while the variation in the value of power is in the range of $-\epsilon$ to $\epsilon$, or in a case where the absolute value of the variation in the value of power is smaller than the threshold value ($\epsilon$) (a1 in FIG. 5), for example, it is determined that the variation is within the margin of error, and no variation due to a gain change has been caused in the value of power. In cases where the variation in the value of power is in the range of "$\Delta G-\epsilon$" to "$\Delta G+\epsilon$" (a2 in FIG. 5), and where the variation in the value of power is in the range of "$-\Delta G-\epsilon$" to "$\Delta G+\epsilon$" (a3 in FIG. 5), or in a case where the absolute value of the variation in the value of power is larger than "$\Delta G-\epsilon$" but smaller than "$\Delta G+\epsilon$", the variation in the value of power is determined to have been caused by a gain change caused by the power amplifier 200. For ease of explanation, the previous value ($P_{prev}$) of power is 0 in FIG. 5. In FIG. 5, each range indicated by a shaded region is equivalent to the predetermined numerical value range.

In this embodiment, as the predetermined numerical value range to be compared with a variation in the value of power, any appropriate value may be selected so as to distinguish a variation caused by a gain change from a variation caused by a state change or an environmental change. For example, to determine that a variation that is n times (n being a natural number of 2 or greater) larger than the minimum gain variable width of the power amplifier 200 is caused in the value of power due to a gain change, a numerical value range may be such that the absolute value of a variation in the value of power is larger than "$n\times\Delta G-\epsilon$" but smaller than "$n\times\Delta G+\epsilon$".

In a case where it is determined that the variation matches the redetermined numerical value range, and no variation in power has been caused by a state change or an environmental change, the control circuit 20 remains in a stopped state, the current value ($P_{now}$) of power is assigned to the previous value ($P_{prev}$) of power, and the comparator circuit 22 continues to perform determination. In a case where it is determined that the variation does not match the predetermined numerical value range, and a variation in power has been caused by a state change or an environmental change, on the other hand, the control circuit 20 is activated.

The control circuit 20 is activated by an activation signal that is output from the starter circuit 24 to the control circuit 20 based on a result of determination performed by the comparator circuit 22. The control circuit 20 controls the variable impedance matching circuit 12, and performs an impedance matching operation according to the flowchart shown in FIG. 2, for example.

According to this embodiment, the probe 14 that serves as a detector is located near the top end of the antenna 10, which is an open end, so that the impedance matching state of the antenna 10 can be evaluated based on the magnitude of power detected by the probe 14. Accordingly, highly-accurate automatic impedance matching can be realized in a wide radio-frequency band with a simple, small-sized structure, regardless of the frequency used by the antenna device 100.

The only loss caused by impedance matching in the antenna device 100 of this embodiment is the power detected by the probe 14. Accordingly, an antenna device with extremely low loss can be realized. Furthermore, with the control circuit 20 controlling the variable impedance matching circuit 12, impedance matching can be automatically performed.

Also, according to this embodiment, the first arithmetic circuit 18, the comparator circuit 22, and the starter circuit 24 are provided, so that a variation in power due to a gain change caused by the power amplifier 200 because of TPC can be distinguished from a variation in power due to impedance mismatching caused by a state change or an environmental change. Furthermore, in a case where it is determined that the variation in power has not been caused by impedance mismatching, the variable impedance matching circuit 12 is not activated, so that unnecessary circuit operations can be avoided. Accordingly, power consumption can be reduced, for example.

A variation in power due to a state change in the variable impedance matching circuit 12 and a variation in power due to an environmental change in the surroundings of the wireless communication apparatus occur when there is impedance mismatching, and either variation has a much lower variation speed than a variation in power due to a gain change caused by the power amplifier 200. Therefore, no serious problems are caused in automatic impedance matching, even if no particular distinguishing processes are performed.

(Second Embodiment)

An antenna device of this embodiment includes: an antenna; a variable impedance matching circuit that is connected to the antenna; a probe that receives power from the antenna; a power detector that is connected to the probe; a control circuit that is connected to the power detector, and controls the variable impedance matching circuit based on a value of power measured by the power detector; a first arithmetic circuit that is connected to the power detector, and calculates a variation in the value of power measured by the power detector; a comparator circuit that compares the variation with a predetermined value; a starter circuit that activates the control circuit based on a result of the comparison performed by the comparator circuit; and a second arithmetic circuit that adds a predetermined bias value to the variation or subtracts the predetermined bias value from the variation based on the result of the comparison performed by the comparator circuit.

A wireless communication apparatus of this embodiment includes: the antenna device; a radio that is connected to the opposite side of the variable impedance matching circuit from the antenna; and a power amplifier that is connected between the variable impedance matching circuit and the radio.

The antenna device of this embodiment is basically the same as that of the first embodiment, except for further including the second arithmetic circuit. Therefore, the same aspects as those of the first embodiment will not be described below.

Figure 6:
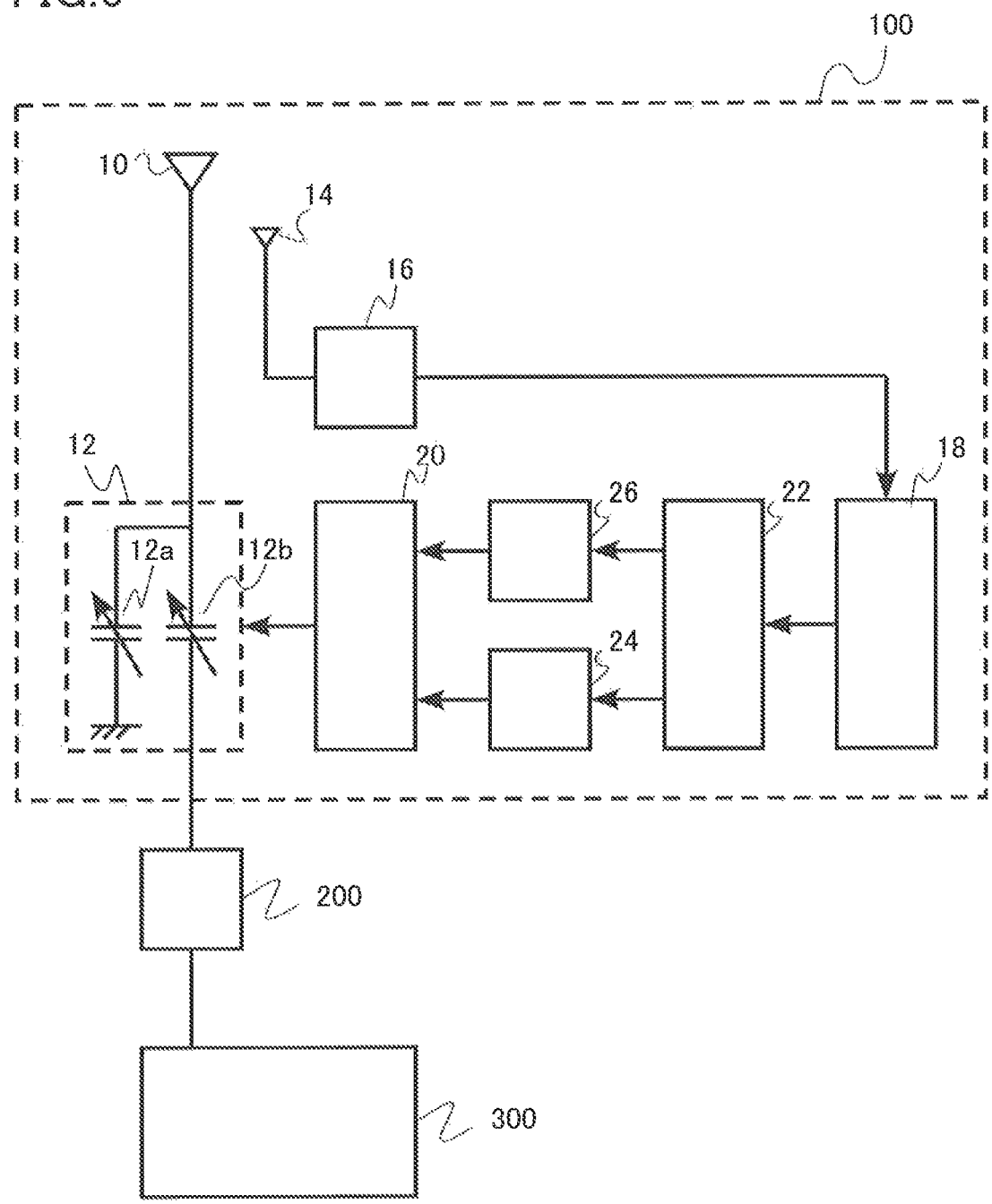
FIG. 6 is a schematic diagram showing the structures of an antenna device and a wireless communication apparatus of a second embodiment.

FIG. 6 is a schematic diagram showing the structures of the antenna device and the wireless communication apparatus of this embodiment. The wireless communication apparatus of this embodiment includes an antenna device 100, a power amplifier 200, and a radio 300. The radio 300 is a transmitter, for example. In this manner, the antenna device 100, the power amplifier 200 connected to the antenna device 100, and the radio 300 constitute the wireless communication apparatus. The wireless communication apparatus is a portable telephone device, for example.

The antenna device 100 includes an antenna 10, a variable impedance matching circuit 12, a probe 14, a power detector 16, a first arithmetic circuit 18, a control circuit 20 a comparator circuit 22, a starter circuit 24, and a second arithmetic circuit 26.

The second arithmetic circuit 26 is connected between the comparator circuit 22 and the control circuit 20. The second arithmetic circuit 26 adds a predetermined bias value to or subtracts the predetermined bias value from a variation in the value of power detected by the power detector 16 based on a result of a comparison performed by the comparator circuit 22. The second arithmetic circuit 26 is realized by a combination of hardware such as a microcomputer and software stored in a semiconductor memory, for example.

For example, in a case where a variation in the value of power matches a predetermined numerical value range within which the variation can be determined to include a variation caused by a gain change, the predetermined bias value is add to or subtracted from the value of power so as to offset the variation caused by a gain change. This bias value is the minimum gain variable width of the power amplifier 200, for example. The control circuit 20 controls the variable impedance matching circuit 12 based on the value of power having the predetermined bias value added thereto or subtracted therefrom.

The functions and effects of the antenna device and the wireless communication apparatus of this embodiment are now described below.

Figure 7:
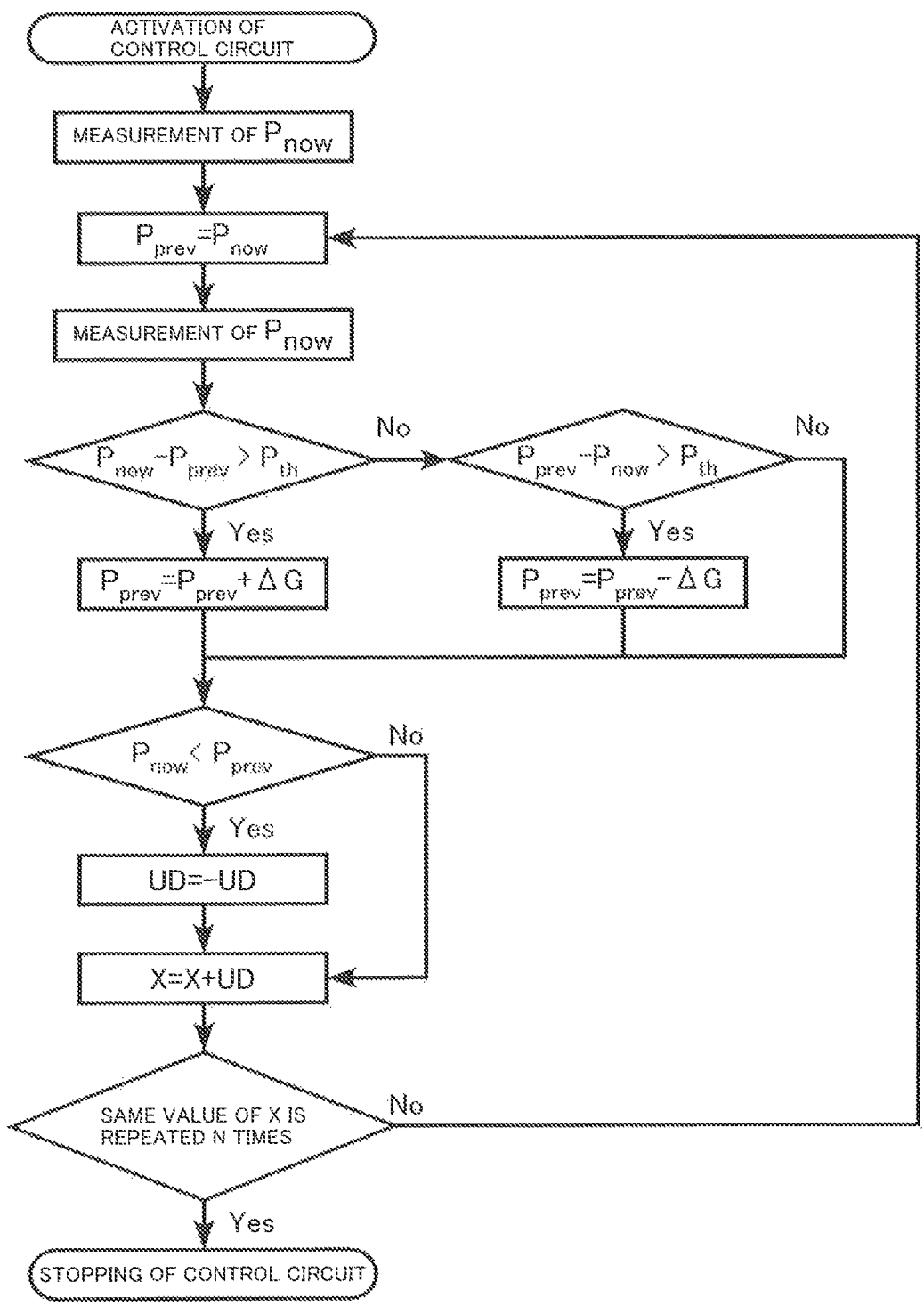
FIG. 7 is a flowchart showing an impedance matching operation of the second embodiment.
Figure 8:
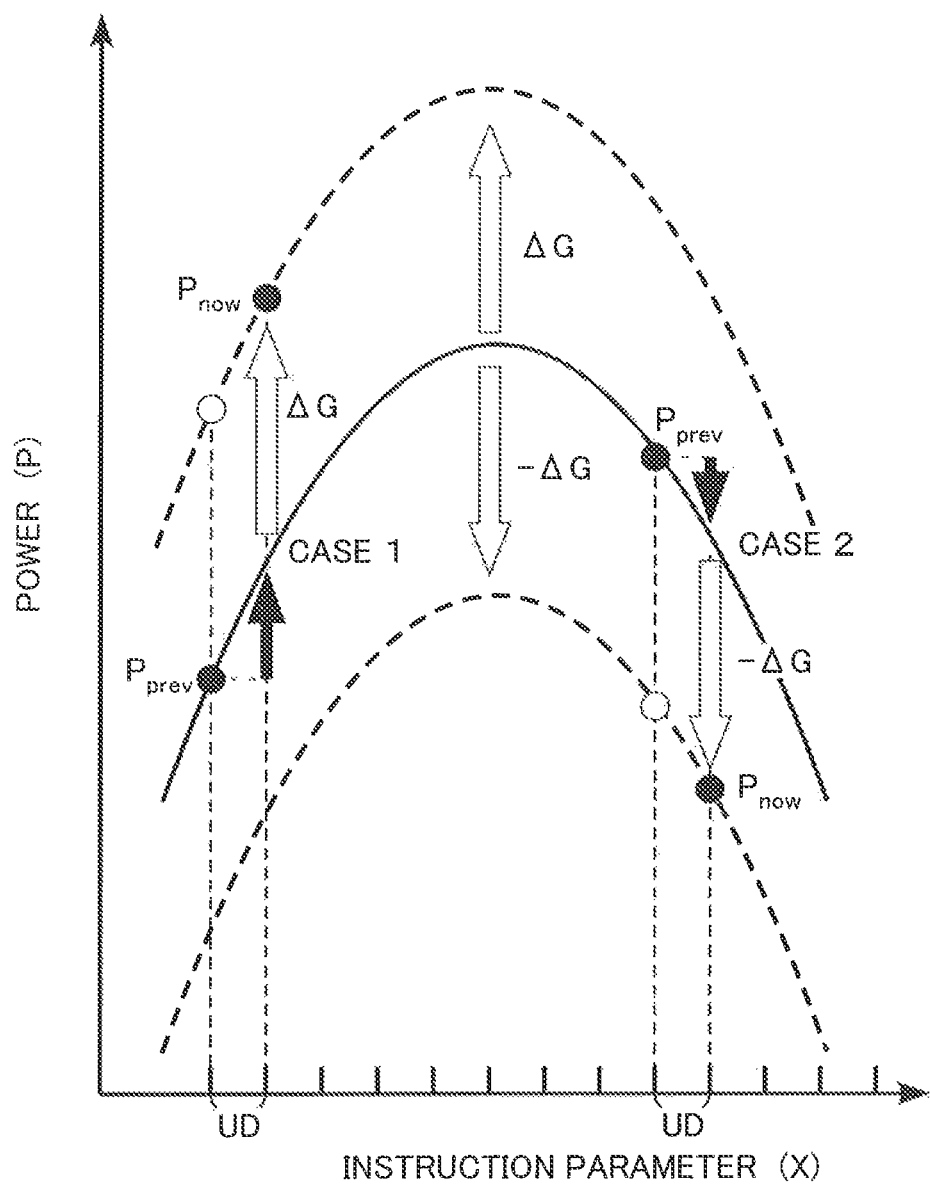
FIG. 8 is a diagram for explaining an impedance matching operation of the second embodiment.

FIG. 7 is a flowchart showing an example of an impedance matching operation according to this embodiment. FIG. 8 is a diagram for explaining an impedance matching operation according to this embodiment.

The control circuit 20 is first activated, and an automatic impedance matching operation by the variable impedance matching circuit 12 is started. The current value ($P_{now}$) of power is then measured by the power detector 16, and the measurement result is input to the first arithmetic circuit 18. The current value ($P_{now}$) of power is then assigned to the previous value ($P_{prev}$) of power. The current value ($P_{now}$) of power is again measured by the power detector 16, and the measurement result is input to the first arithmetic circuit 18.

A difference ($P_{now}-P_{prev}$) between the current value ($P_{now}$) and the previous value ($P_{prev}$), or a variation in the value of power, is compared with a predetermined threshold value ($P_{th}$). A difference ($P_{prev}-P_{now}$) between the previous value ($P_{prev}$) and the current value ($P_{now}$), or a variation in power, is compared with the predetermined threshold value ($P_{th}$). This comparison is performed by the comparator circuit 22.

In a case where the difference ($P_{now}-P_{prev}$) is larger than the predetermined threshold value ($P_{th}$), the variation in the value of power is determined to match a predetermined numerical value range within which the variation can be determined to include a variation caused by a gain change. This is a case where power is increased by the power amplifier 200 during an impedance matching operation, as in case 1 in FIG. 8, for example. In this case, an increase in the value of power caused by a state change or an environmental change (a black arrow in FIG. 8) and an increase in the value of power caused by a gain change (a white arrow in FIG. 8) are included in the variation in the value of power. Therefore, so as to efficiently perform impedance matching while avoiding an incorrect operation, the increase in the value of power caused by a gain change is preferably compensated by a bias value.

In view of the above, a value ($P_{prev}+\Delta G$) obtained by adding the minimum gain variable width $\Delta G$ (dB) of the power amplifier 200 as an increase in the value of power caused by a gain change to the previous value ($P_{prev}$) is assigned to the previous value ($P_{prev}$) of power. The predetermined threshold value ($P_{th}$) is a value obtained by subtracting a certain value from the minimum gain variable width $\Delta G$ (dB) of the power amplifier 200, for example.

In a case where the difference ($P_{now}-P_{prev}$) is smaller than the predetermined threshold value ($P_{th}$), and the difference ($P_{now}-P_{prev}$) between the previous value ($P_{prev}$) and the current value ($P_{now}$) is larger than the predetermined threshold value ($P_{th}$), the variation in the value of power is also determined to match the predetermined numerical value range within which the variation can be determined to include a variation caused by a gain change. This is a case where power is decreased by the power amplifier 200 during an impedance matching operation, as in case 2 in FIG. 8, for example. In this case, a decrease in the value of power caused by a state change or an environmental change (a black arrow in FIG. 8) and a decrease in the value of power caused by a gain change (a white arrow in FIG. 8) are included in the variation in the value of power. Therefore, so as to efficiently perform impedance matching while avoiding an incorrect operation, the decrease in the value of power caused by a gain change is preferably compensated by a bias value.

In view of the above, a value ($P_{prev}-\Delta G$) obtained by subtracting the minimum gain variable width $\Delta G$ (dB) of the power amplifier 200 as a decrease in the value of power caused by a gain change from the previous value ($P_{prev}$) is assigned to the previous value ($P_{prev}$) of power. The predetermined threshold value ($P_{th}$) is a value obtained by subtracting a certain value from the minimum gain variable width ΔG (dB) of the power amplifier 200, for example.

In a case where the difference ($P_{now}-P_{prev}$) is equal to or smaller than the predetermined threshold value ($P_{th}$), and the difference ($P_{prev}-P_{now}$) between the previous value ($P_{prev}$) and the current value ($P_{now}$) is also equal to or smaller than the predetermined threshold value ($P_{th}$), the variation in the value of power is determined not to include a variation caused by a gain change. Therefore, the addition or subtraction of the bias value is not performed.

The addition or subtraction of the bias value is performed by the second arithmetic circuit 26.

The current value ($P_{now}$) is compared with the previous value ($P_{prev}$), to determine which value is larger. In this manner, an increase/decrease in the power released from the antenna 10 is determined.

If the current value ($P_{now}$) is larger than the previous value ($P_{prev}$) (case 1 in FIG. 8), "X+UD" is assigned to X. If the current value ($P_{now}$) is smaller than the previous value ($P_{prev}$) (case 2 in FIG. 8), −UD with the opposite sign is assigned to UD, and "X+UD" is then assigned to X.

Here, X represents the instruction parameter for indicating the impedance value of the variable impedance elements in the variable impedance matching circuit 12. UD represents the minimum unit of the instruction parameter. As X is changed with UD as the minimum unit, the impedance of the variable impedance matching circuit 12 varies, and the power to be emitted from the antenna 10 also varies with the state of impedance matching. The instruction parameter is the reactance value of the variable capacitances 12*a* and 12*b*, for example.

If the current value ($P_{now}$) is larger than the previous value ($P_{prev}$) (case 1 in FIG. 8), "X+UD" is assigned to X as described above, so as to maintain the direction of change in X in one direction. With this, the power to be emitted from the antenna 10 increases. If the current value ($P_{now}$) is smaller than the previous value ($P_{prev}$) (case 2 in FIG. 1), on the other hand, −UD with the opposite sign is assigned to UD, and "X+UD" is then assigned to X, so as to switch the direction of change in X to the opposite direction. With this, the value of X varies in the opposite direction, and the power to be emitted from the antenna 10 increases. In this manner, the variable impedance matching circuit 12 is controlled so as to maximize the power to be emitted from the antenna 10.

In a case where the same value of X is repeated N times (N being a predetermined natural number), it is determined that the power to be emitted from the antenna 10 is maximized, and impedance matching is achieved. Accordingly, the operation of the control circuit 20 is stopped. The number of times the direction of change in impedance is switched is measured by counting the number of times the same value of X is repeated.

In this embodiment, the minimum variation width of the value of power at the time when the control circuit 20 controls the variable impedance matching circuit 12 is preferably smaller than the minimum gain variable width of the power amplifier 200. That is, the variation width of the value of power at the time when the instruction parameter X is changed by UD, which is the minimum unit thereof, is preferably smaller than the minimum gain variable width ΔG (dB) of the power amplifier 200. With this arrangement, a check can be easily made to determine whether a variation in the value of power includes a variation caused by a gain change.

The operation related to activation of the control circuit 20 is the same as that of the first embodiment.

According to this embodiment, TPC is performed during an automatic impedance matching operation. Even if an increase or a decrease in power is caused by the power amplifier 200, the comparator circuit 22 determines whether there is a variation in power caused by the gain change. Furthermore, the variation in the value of power caused by the gain change is compensated by adding an appropriate bias value to the detected value of power or subtracting the appropriate bias value from the detected value of power. Accordingly, an impedance matching operation can be performed based on variations in the value of power caused by state changes or environmental changes. Thus, unnecessary operations are avoided, and automatic impedance matching can be efficiently performed. Also, incorrect operations in automatic impedance matching can be prevented.

(Third Embodiment)

An antenna device of this embodiment includes: an antenna; a variable impedance matching circuit that is connected to the antenna; a probe that receives power from the antenna; a power detector that is connected to the probe; a control circuit that is connected to the power detector, and controls the variable impedance matching circuit based on a value of power measured by the power detector; a first arithmetic circuit that is connected to the power detector, and calculates a variation in the value of power measured by the power detector; a comparator circuit that compares the variation with a predetermined numerical value range; and a second arithmetic circuit that adds a predetermined bias value to the value of power or subtracts the predetermined bias value from the value of power based on a result of the comparison performed by the comparator circuit.

A wireless communication apparatus of this embodiment includes: the antenna device; a radio that is connected to the opposite side of the variable impedance matching circuit from the antenna; and a power amplifier that is connected between the variable impedance matching circuit and the radio.

The antenna device of this embodiment is basically the same as that of the second embodiment, except for not including a starter circuit. Therefore, the same aspects as those of the second embodiment will not be described below.

Figure 9:
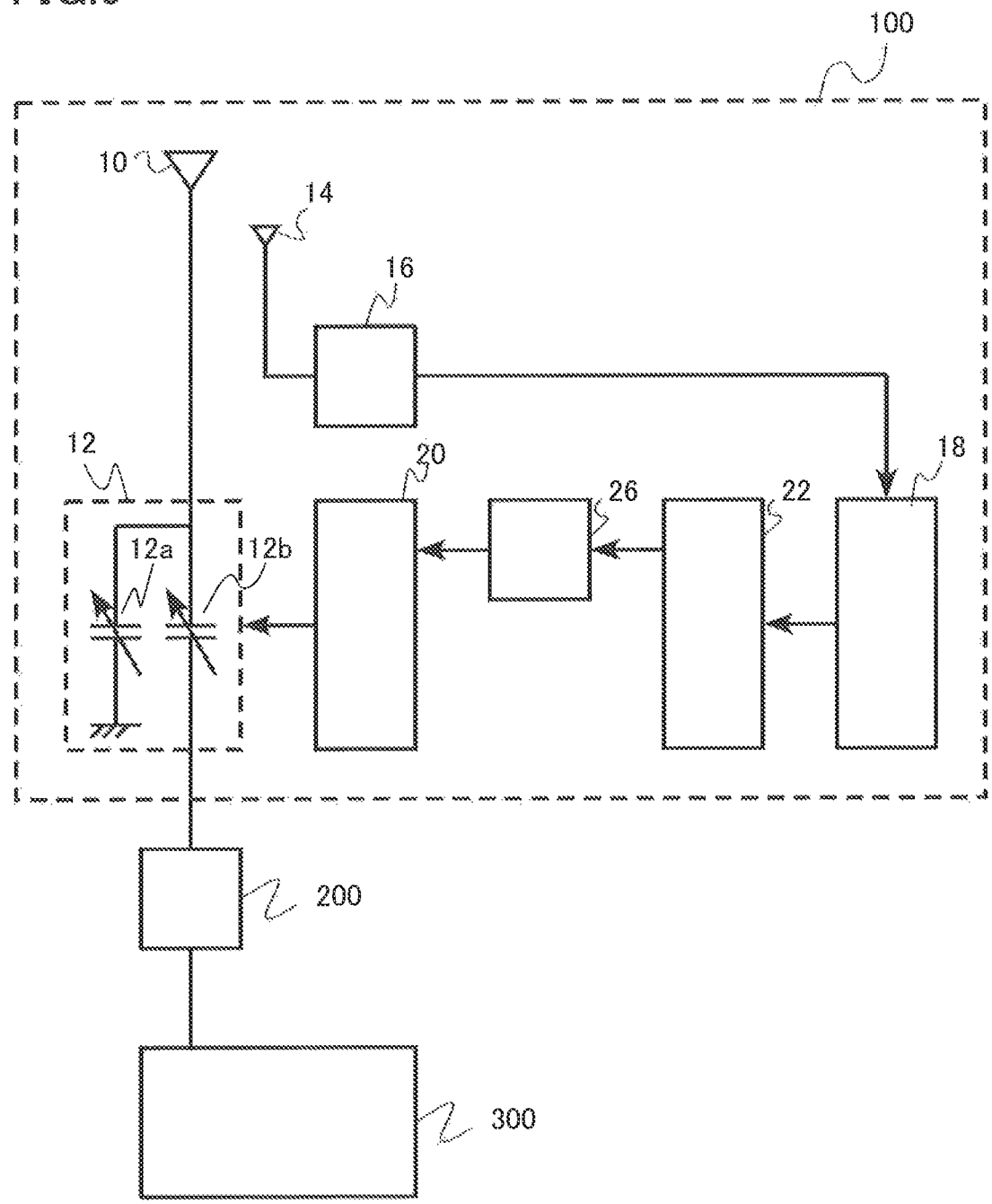
FIG. 9 is a schematic diagram showing the structures of an antenna device and a wireless communication apparatus of a third embodiment.

FIG. 9 is a schematic diagram showing the structures of the antenna device and the wireless communication apparatus of this embodiment. The wireless communication apparatus of this embodiment includes an antenna device 100, a power amplifier 200, and a radio 300. The radio 300 is a transmitter, for example. In this manner, the antenna device 100, the power amplifier 200 connected to the antenna device 100, and the radio 300 constitute the wireless communication apparatus. The wireless communication apparatus is a portable telephone device, for example.

The antenna device 100 includes an antenna 10, a variable impedance matching circuit 12, a probe 14, a power detector 16, a first arithmetic circuit 18, a control circuit 20, a comparator circuit 22, and a second arithmetic circuit 26.

In this embodiment, the control circuit 20 may be constantly in an activated state, for example.

According to this embodiment, an impedance matching operation can be performed based on variations in the value of power caused by state changes or environmental changes, as in the second embodiment. Accordingly, unnecessary operations are avoided, and impedance matching can be efficiently performed. Also, incorrect operations in impedance matching can be prevented.

(Fourth Embodiment)

An antenna device of this embodiment is the same as that of the first embodiment, except that the comparator circuit compares a variation in power with a predetermined numerical value range, the first arithmetic circuit repeatedly calculates the variation in power, and the starter circuit activates the control circuit when the variation matches the predetermined numerical value range for the first time after the variation failed to match the predetermined numerical value range. Therefore, the same aspects as those of the first embodiment will not be described below.

In this embodiment, when the comparator circuit 22 determines that a variation in the value of power does not match the predetermined numerical value range within which the variation can be determined to have been caused by a gain change, the control circuit 20 is activated after a standby period has elapsed, and an impedance matching operation is started. This standby period is the period that lasts until the comparator circuit 22 determines that the variation in the value of power matches the predetermined numerical value range within which the variation can be determined to have been caused by a gain change.

Figure 10:
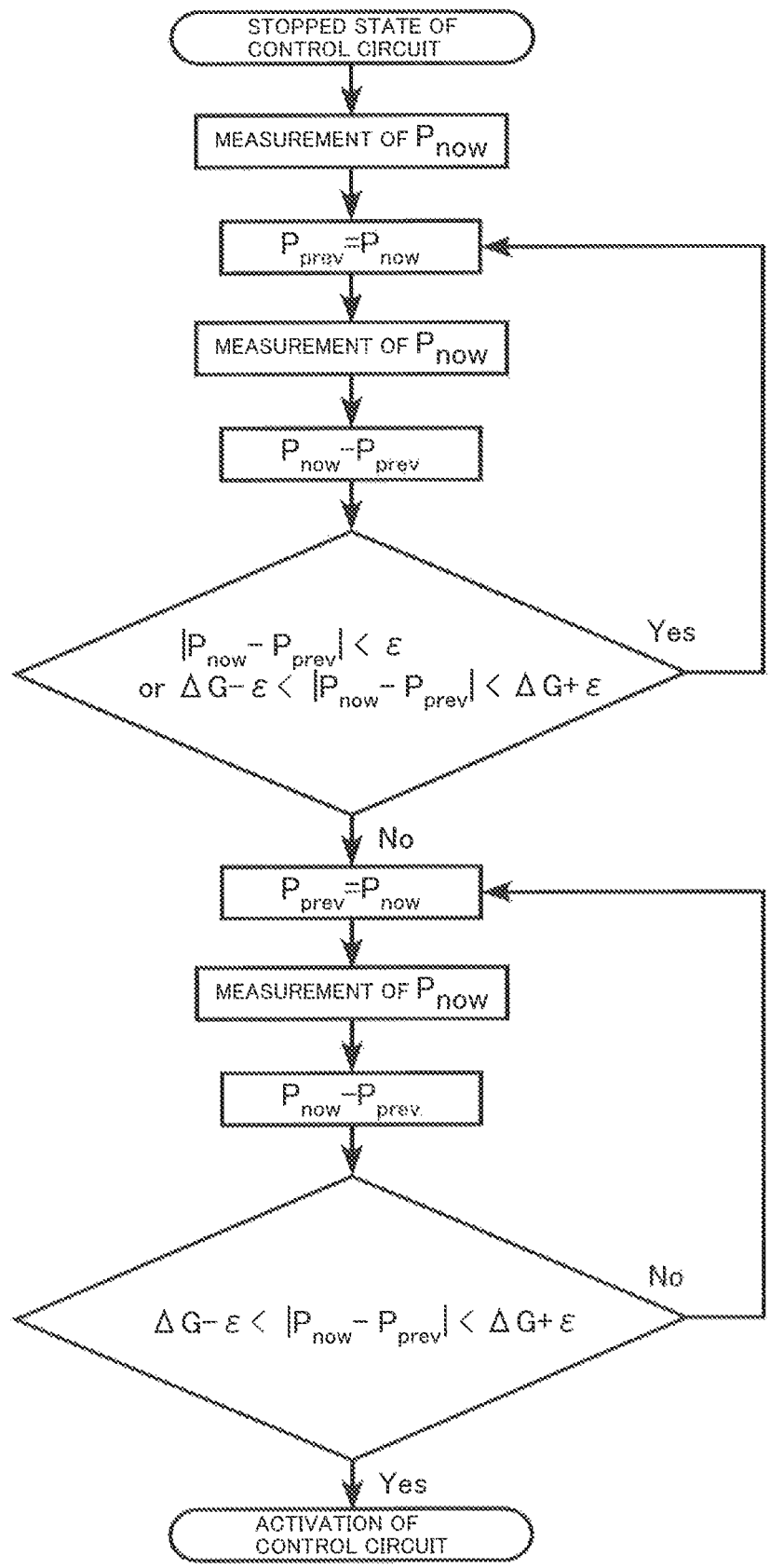
FIG. 10 is a flowchart showing a control circuit activating operation of a fourth embodiment.

The functions and effects of the antenna device and the wireless communication apparatus of this embodiment are now described below. FIG. 10 is a flowchart showing an example of a control circuit activating operation according to this embodiment.

In a steady state, the control circuit 20 is not operating. Even in a state where the control circuit 20 is not operating, power measurement is performed by the power detector 16. First, the current value ($P_{now}$) of power is measured by the power detector 16, and the measurement result is input to the first arithmetic circuit 18. The current value ($P_{now}$) of power is then assigned to the previous value ($P_{prev}$) of power. The current value ($P_{now}$) of power is again measured by the power detector 16, and the measurement result is input to the first arithmetic circuit 18.

A variation in power, or a difference ($P_{now}-P_{prev}$) between the current value ($P_{now}$) of power and the previous value ($P_{prev}$) of power, is calculated. The variation ($P_{now}-P_{prev}$) in power is calculated by the first arithmetic circuit 18. The variation ($P_{now}-P_{prev}$) in power is expressed by the absolute value thereof, for example.

The absolute value of the variation ($P_{now}-P_{prev}$) in the value of power is then compared with the predetermined numerical value range. This comparison is performed by the comparator circuit 22. A check is made to determine whether the absolute value of the variation ($P_{now}-P_{prev}$) in the value of power is not larger than a threshold value ($\epsilon$), for example. Also, a check is made to determine whether the absolute value of the variation is larger than "$\Delta G-\epsilon$" but smaller than "$\Delta G+\epsilon$", for example. Here, $\Delta G$ represents the minimum gain variable width $\Delta G$ (dB) of the power amplifier 200.

In a case where it is determined that the variation matches the predetermined numerical value range, and no variation in power has been caused by a state change or an environmental change, the control circuit 20 remains in a stopped state, the current value ($P_{now}$) of power is assigned to the previous value ($P_{prev}$) of power, and the comparator circuit 22 continues to perform determination.

In a case where it is determined that the variation does not match the predetermined numerical value range, and a variation in power has been caused by a state change or an environmental change, the control circuit 20 is also maintained in a stopped state until the standby period has elapsed. The current value ($P_{now}$) of power is then assigned to the previous value ($P_{prev}$) of power, and the comparator circuit 22 continues to perform determination. After that, when the variation in power matches the predetermined numerical value range for the first time, the control circuit 20 is activated.

Specifically, a variation in power, or a difference ($P_{now}-P_{prev}$) between the current value ($P_{now}$) of power and the previous value ($P_{prev}$) of power, is calculated. The variation ($P_{now}-P_{prev}$) in power is calculated by the first arithmetic circuit 18. The variation ($P_{now}-P_{prev}$) in power is expressed by the absolute value thereof, for example.

The absolute value of the variation ($P_{now}-P_{prev}$) in the value of power is then compared with the predetermined numerical value range. This comparison is performed by the comparator circuit 22. A check is made to determine whether the absolute value of the variation ($P_{now}-P_{prev}$) in the value of power is larger than "$\Delta G-\epsilon$" but smaller than "$\Delta G+\epsilon$". Here, $\Delta G$ represents the minimum gain variable width $\Delta G$ (dB) of the power amplifier 200.

In a case where it is determined that the variation does not match the predetermined numerical value range, and no variation in power has been caused by a gain change, the control circuit 20 remains in a stopped state, the current value ($P_{now}$) of power is assigned to the previous value ($P_{prev}$) of power, and the comparator circuit 22 continues to perform determination. In a case where it is determined that the variation matches the predetermined numerical value range, and a variation in power has been caused by a gain change, the standby period comes to an end, and the control circuit 20 is activated by the starter circuit 24.

So as to compare a variation with the predetermined numerical value range, a second comparator circuit that differs from the comparator circuit 22 may be provided.

According to this embodiment, the control circuit 20 is not activated until TPC is performed for the first time after a variation in power is caused by a state change or an environmental change. That is, an impedance matching operation is not performed until TPC is performed for the first time, and an impedance matching is performed only after TPC is performed.

Once TPC is performed, there is a high probability that a certain period of time elapses before the next TPC is performed. As a result, the possibility that TPC is performed during an impedance matching operation is lowered. Accordingly, a variation in power is caused by a gain change during an impedance matching operation, and unnecessary impedance matching operations and incorrect operations can be avoided.

(Fifth Embodiment)

An antenna device of this embodiment is basically the same as that of the first embodiment, except for further including a storage element that stores a relationship between the radio frequency to be used in the antenna device and the optimum impedance state of the variable impedance matching circuit. Therefore, the same aspects as those of the first embodiment will not be described below.

A wireless communication apparatus of this embodiment includes: the antenna device; a radio that is connected to the opposite side of the variable impedance matching circuit from the antenna; and a power amplifier that is connected between the variable impedance matching circuit and the radio.

Figure 11:
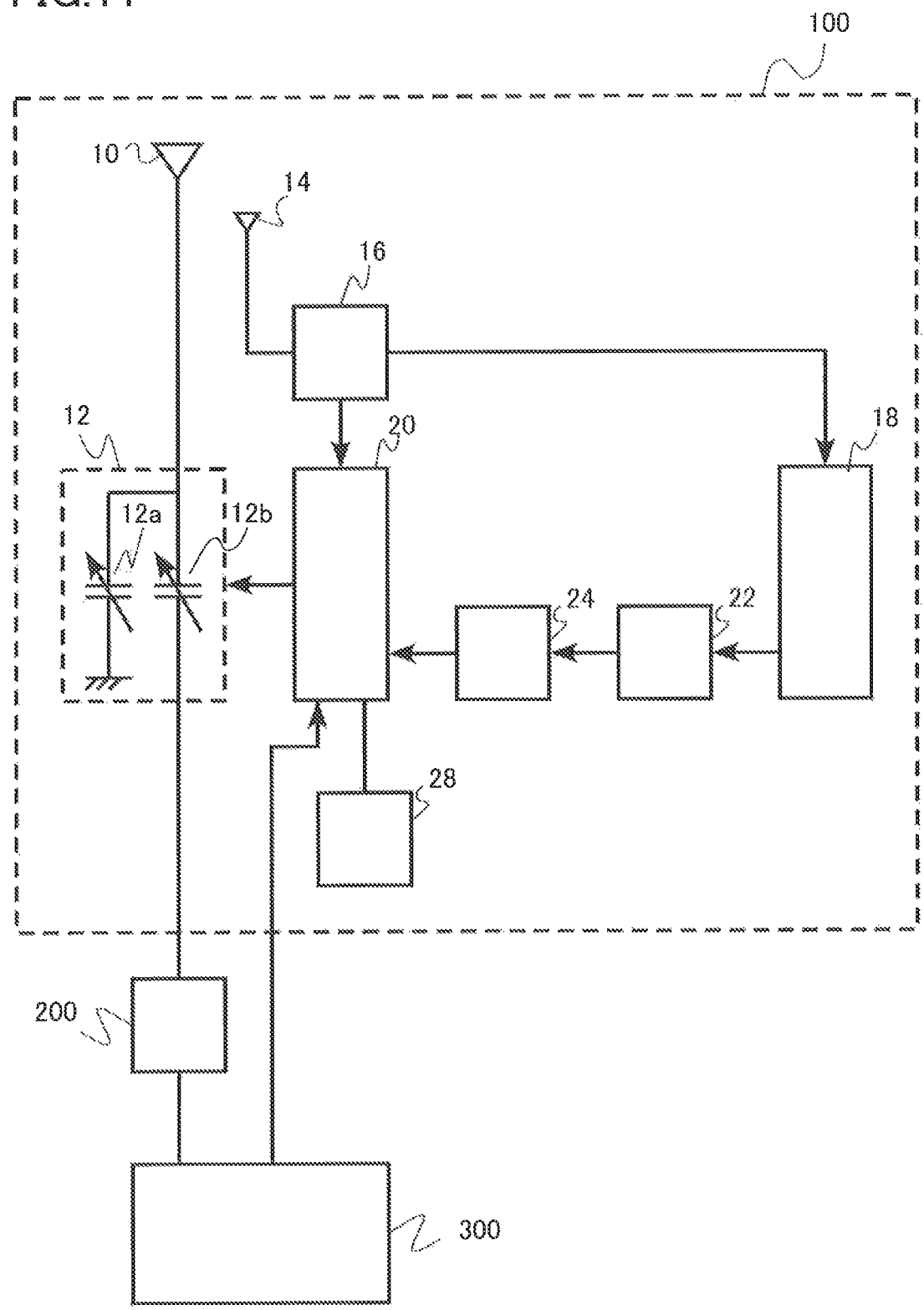
FIG. 11 is a schematic diagram showing the structures of an antenna device and a wireless communication apparatus of a fifth embodiment.

FIG. 11 is a schematic diagram showing the structures of the antenna device and the wireless communication apparatus of this embodiment. The wireless communication apparatus of this embodiment includes an antenna device 100, a power amplifier 200, and a radio 300.

The antenna device 100 includes a storage element 28. The storage element 28 stores the relationship between the radio frequency to be used in the antenna device 100 and the optimum impedance state of the variable impedance matching circuit 12. Specifically, the storage element 28 stores a table that shows the relationship between a radio frequency and the instruction parameter X for giving the variable impedance matching circuit 12 the optimum impedance value to achieve impedance matching at the radio frequency.

The storage element 28 is a semiconductor memory, for example.

Information about the radio frequency to be used in the antenna device 100 is transmitted as a signal from the radio 300 to the control circuit 20, for example. The control circuit 20 acquires, from the storage element 28, the instruction parameter X for realizing the optimum impedance state for the radio frequency transmitted from the radio 300. Based on the instruction parameter X, the control circuit 20 controls the variable impedance matching circuit 12.

In a case where the wireless communication apparatus uses more than one radio-frequency band, for example, the optimum instruction parameter X varies with the respective radio-frequency bands. Even in the same frequency band, the optimum instruction parameter X may vary with the respective radio frequencies in the band.

According to this embodiment, the optimum instruction parameter X for the radio frequency to be used at the time of activation of the control circuit 20 can be set as the initial value, for example, and impedance matching is then performed. In a case where the radio frequency being used varies during a communication, for example, the instruction parameter X is switched to the optimum instruction parameter X for the radio frequency being used, so that impedance matching can be performed with this instruction parameter X serving as the initial value. Accordingly, quick impedance matching can be performed. Furthermore, unnecessary circuit operations for impedance matching are avoided, and accordingly, power consumption can be reduced.

(Sixth Embodiment)

An antenna device of this embodiment is the same as that of the first embodiment, except that the shape of the antenna and the positional relationship between the antenna and the probe are specified. Therefore, the same aspects as those of the first embodiment will not be described below.

In this embodiment, the antenna has a feeding point and end portions that are separated from the feeding point, and the distance between an end portion of the antenna and the edge of the probe is equal to or shorter than one eighth of the wavelength corresponding to the maximum radio frequency to be used in the antenna device.

Figure 12:
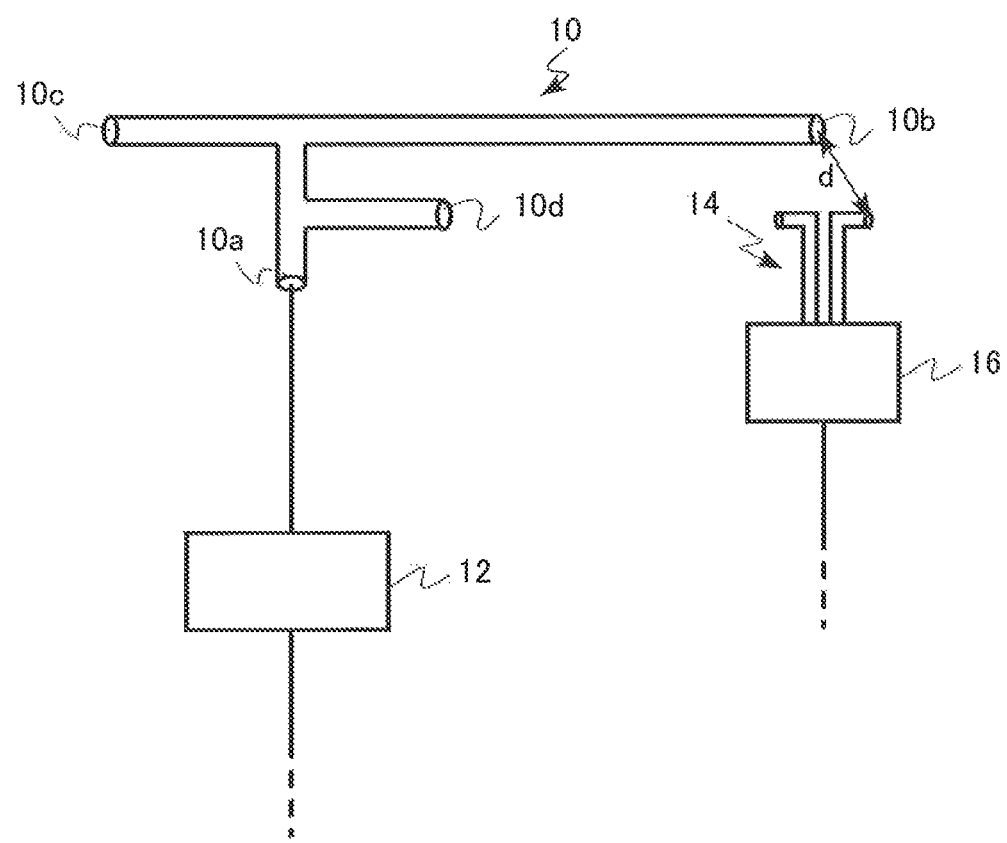
FIG. 12 is a diagram schematically showing the shapes of an antenna and a probe of a sixth embodiment.

FIG. 12 is a diagram schematically showing the shapes of the antenna and the probe of this embodiment. The antenna 10 is a branched conductor. The antenna 10 has a feeding point 10a that is connected to the variable impedance matching circuit 12, and end portions 10b, 10c, and 10d that are separated from the feeding point 10a. Having a branched structure, the antenna 10 resonates at more than one frequency, and can achieve impedance matching at more than one frequency. The shape of the antenna 10 is not necessarily limited to the shape shown in FIG. 12.

The probe 14 in this embodiment is a differential probe that is in the form of a dipole formed with two symmetrical conductors, for example. So as to increase resistance to noise generated from an electronic component or the like of the wireless communication apparatus to which the antenna device is connected, the probe 14 is preferably a differential probe, but may be a probe in the form of a monopole or a loop.

The antenna 10 and the probe 14 are arranged at a close distance from each other, so that the distance (d in FIG. 12) between the end portion 10b of the longest branch portion of the branched antenna 10 or the end portion 10b at the longest distance from the feeding point 10a and the edge of the probe 14 is equal to or shorter than one eighth of the wavelength corresponding to the maximum radio frequency to be used in the antenna device 100. So as to increase the accuracy in impedance matching, regardless of the radio frequency to be used, the distance between the end portion 10b of the longest branch portion of the branched antenna 10 and the edge of the probe 14 preferably establishes the above described relationship.

The end portion 10b of the longest branch portion of the antenna 10 tends to gather the largest amount of charges when impedance matching is achieved not depending on the radio frequency being used. Therefore, the power detected by the probe 14 is larger than at the other end portions 10c and 10d. Accordingly, the accuracy in impedance matching is increased.

(Seventh Embodiment)

An antenna device of this embodiment includes: an antenna; a variable impedance matching circuit that is connected to the antenna; a probe that receives power from the antenna; a first power detector that is connected to the probe; a control circuit that is connected to the first power detector, and controls the variable impedance matching circuit based on a value of power measured by the first power detector; a second power detector that is connected to the opposite side of the variable impedance matching circuit from the antenna; a comparator circuit that compares a first power value measured by the first power detector with a second power value measured by the second power detector; and a starter circuit that activates the control circuit based on a result of the comparison performed by the comparator circuit.

A wireless communication apparatus of this embodiment includes: the antenna device; a radio that is connected to the opposite side of the variable impedance matching circuit from the antenna; and a power amplifier that is connected between the variable impedance matching circuit and the radio.

Figure 13:
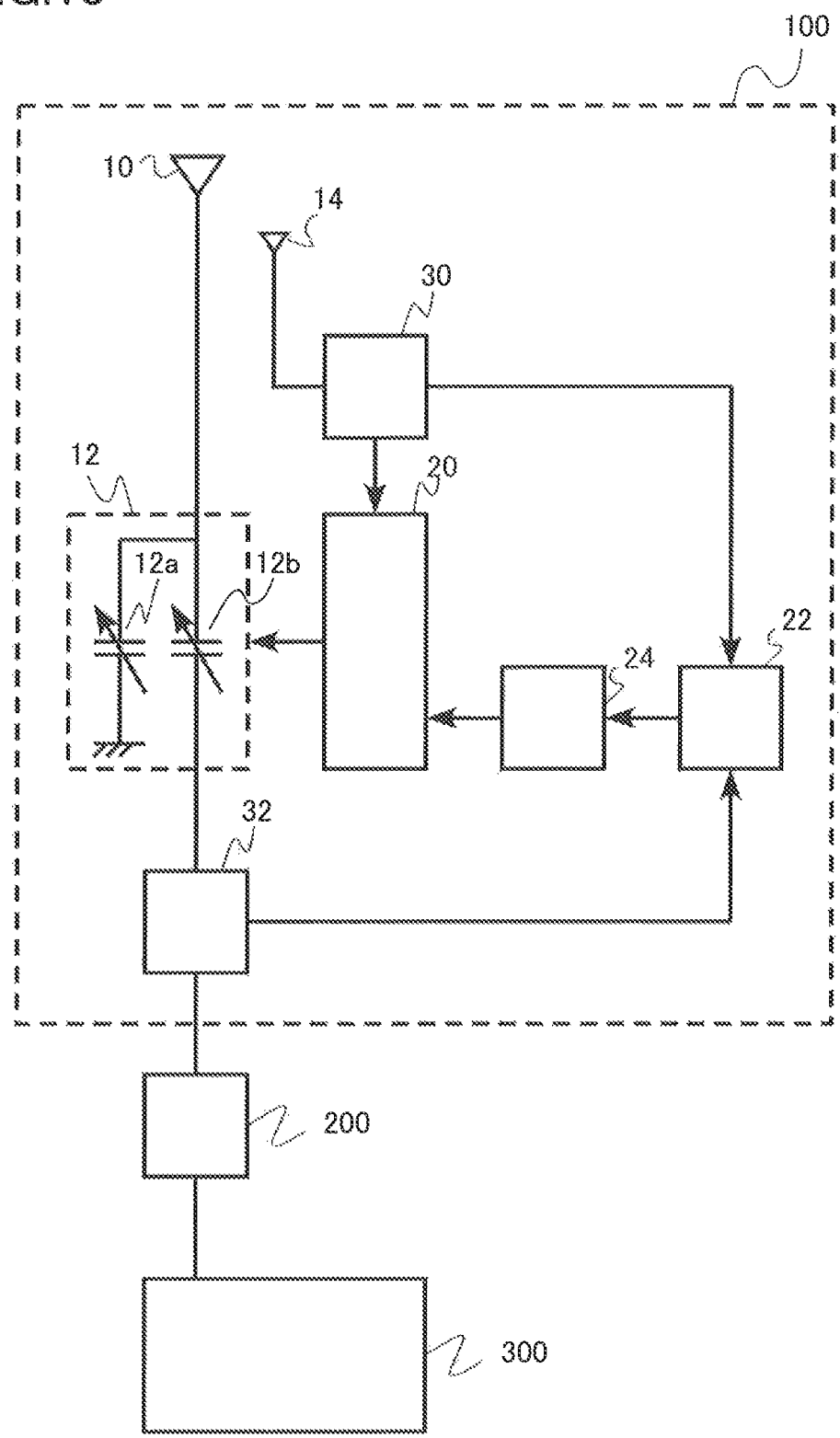
FIG. 13 is a schematic diagram showing the structures of an antenna device and a wireless communication apparatus of a seventh embodiment.

FIG. 13 is a schematic diagram showing the structures of the antenna device and the wireless communication apparatus of this embodiment. The wireless communication apparatus of this embodiment includes an antenna device 100, a power amplifier 200, and a radio 300. The radio 300 is a transmitter, for example. In this manner, the antenna device 100, the power amplifier 200 connected to the antenna device 100, and the radio 300 constitute the wireless communication apparatus. The wireless communication apparatus is a portable telephone device, for example.

The antenna device 100 includes an antenna 10, a variable impedance matching circuit 12, a probe 14, a first power detector 30, a second power detector 32, a control circuit 20 a comparator circuit 22, and a starter circuit 24.

The antenna 10 is a conductor. The antenna 10 transmits a signal that is transferred from the radio 300. The antenna 10 is an inverted L antenna that has its open end at the end on the opposite side from its feeding point, for example. Using an inverted L antenna is desirable in reducing the size and simplifying the design of the wireless communication apparatus including the antenna device 100, but the shape of the antenna 10 is not limited to an inverted L.

The variable impedance matching circuit 12 is connected to the feeding point of the antenna 10. The variable impedance matching circuit 12 matches the input impedance of the antenna 10 and the output impedance of the radio 300 by performing impedance adjustment.

The variable impedance matching circuit 12 is formed with two variable capacitances 12a and 12b, for example. There are no restrictions on the number of variable capacitances to be used and the circuit connection topology. Other than variable capacitances, variable inductors or switches may be used as variable impedance elements. Functions of those variable elements can be realized by semiconductors, MEMS (Micro Electro Mechanical Systems), or the like.

The probe 14 is a differential probe that is in the form of a dipole formed with two symmetrical conductors, for example. The probe 14 is located near the edge of the antenna 10, and receives power from the antenna 10. So as to increase resistance to noise generated from an electronic component or the like of the wireless communication apparatus to which the antenna device 100 is connected, the probe 14 is preferably a differential probe, but may be a probe in the form of a monopole or a loop.

The first power detector 30 is connected to the probe 14. The first power detector 30 measures the value of power (a first power value: $P_1$) received by the probe 14. The first power detector 30 has a function to output a DC voltage, a DC current, or binary data corresponding to the intensity of a power signal received by the probe 14.

The control circuit 20 is connected between the first power detector 30 and the variable impedance matching circuit 12. The control circuit 20 controls the variable impedance matching circuit 12 so as to match the input impedance of the antenna 10 and the output impedance of the radio 300 based on the above variation. The control circuit 20 is realized by a combination of hardware such as a microcomputer and software stored in a semiconductor memory, for example.

The control circuit 20 controls the variable impedance matching circuit 12 so that the value of power to be detected by the first power detector 30 will be maximized, for example. Where the power to be emitted from the antenna 10 is maximized, it can be determined that impedance matching is achieved. Specifically, the control circuit 20 changes reactance values of the variable capacitances 12a and 12b, for example.

The second power detector 32 is connected to the opposite side of the variable impedance matching circuit 12 from the antenna 10. The second power detector 32 measures the value of power (a second power value: $P_2$) that is input from the radio 300 to the antenna 10 via the power amplifier 200. The second power detector 32 has a function to output a DC voltage, a DC current, or binary data corresponding to the intensity of a power signal received by the probe 14.

The comparator circuit 22 is connected to the first power detector 30 and the second power detector 32. The comparator circuit 22 compares the first power value measured by the first power detector 30 with the second power value measured by the second power detector 32. The comparator circuit 22 is realized by a combination of hardware such as a microcomputer and software stored in a semiconductor memory, for example.

The starter circuit 24 is connected between the comparator circuit 22 and the control circuit 20. The starter circuit 24 activates the control circuit 20 based on a result of the comparison performed by the comparator, circuit 22. The starter circuit 24 is realized by a combination of hardware such as a microcomputer and software stored in a semiconductor memory, for example.

In a case where the comparator circuit 22 can determine that a variation in power has been caused by a state change or an environmental change based on a result of a comparison between the first power value ($P_1$) and the second power value ($P_2$), for example, the control circuit 20 is activated, and an impedance matching operation is started. In a case where the comparator circuit 22 can determine that no variation in power has been caused by a state change or an environmental change based on a result of a comparison between the first power value ($P_1$) and the second power value ($P_2$), for example, the control circuit 20 is not activated, and an impedance matching operation is not performed.

The radio 300 is connected to the opposite side of the variable impedance matching circuit 12 from the antenna 10. The power amplifier 200 is connected between the variable impedance matching circuit 12 and the radio 300.

The radio 300 is a transmitter, for example. The power amplifier 200 is a variable gain amplifier, for example.

In a case where the power amplifier 200 is a variable gain amplifier, the power that is output from the radio 300 can be increased or decreased in a stepwise manner. The minimum gain variable width of the power amplifier 200 is represented by $\Delta G$ (dB). The minimum gain variable width $\Delta G$ is a value of power that serves as a unit of a power increase/decrease caused by the power amplifier 200. For example, when the power amplifier 200 decreases the power transmitted to the antenna 10 by $\Delta G$, the power emitted by the antenna 10 also decreases by $\Delta G$.

The functions and effects of the antenna device and the wireless communication apparatus of this embodiment are now described below.

The control on the variable impedance matching circuit 12 by the control circuit 20 is the same as that in the first embodiment, and therefore, explanation thereof will not be repeated.

Figure 14:
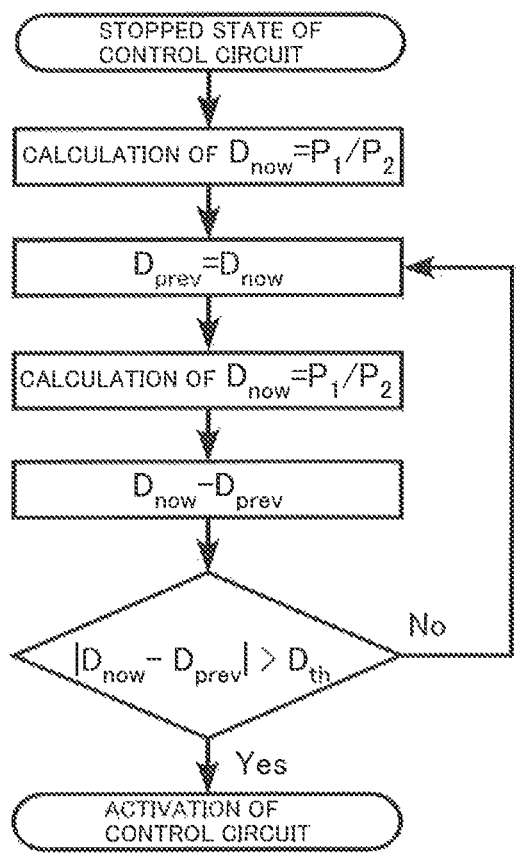
FIG. 14 is a flowchart showing a control circuit activating operation of the seventh embodiment.

Next, an operation related to activation of the control circuit 20 is described. FIG. 14 is a flowchart showing an example of a control circuit activating operation according to this embodiment.

When the power of the radio 300 is amplified by the power amplifier 200, and the power to be output to the antenna 10 is increased accordingly, for example, the power to be emitted from the antenna 10 also becomes larger in proportion to the power that is output to the antenna 10. Therefore, in a case where a variation in the power released from the antenna 10 is caused by a gain change, a ratio ($D=P_1/P_2$) between the first power value ($P_1$) detected by the first power detector 30 and the second power value ($P_2$) detected by the second power detector 32 is a constant value.

In a case where impedance mismatching is caused by a change in the state of the variable impedance matching circuit 12 or a change in the environment surrounding the wireless communication apparatus, which is a state change or an environmental change, and a variation is caused in the power released from the antenna 10, the ratio ($D=P_1/P_2$) between the first power value ($P_1$) detected by the first power detector 30 and the second power value ($P_2$) detected by the second power detector 32 varies. Accordingly, it is possible to determine whether impedance mismatching has been caused by a state change or an environmental change, by calculating the ratio ($D=P_1/P_2$) between the first power value ($P_1$) and the second power value ($P_2$).

In a steady state, the control circuit 20 is not operating. Even in a state where the control circuit 20 is not operating, power measurement is performed by the first and second power detectors 30 and 32. First, the first power value ($P_1$) is measured by the first power detector 30, and the measurement result is input to the comparator circuit 22. The second power value ($P_2$) is also measured by the second power detector 32, and the measurement result is input to the comparator circuit 22. The ratio ($D=P_1/P_2$) between the first power value ($P_1$) and the second power value ($P_2$) is then calculated.

The current value ($D_{now}$) of the ratio ($D=P_1/P_2$) between the first power value ($P_1$) and the second power value ($P_2$) is assigned to the previous value ($D_{prev}$) of the ratio. The first power value ($P_1$) and the second power value ($P_2$) are again measured by the first and second power detectors 30 and 32, and the measurement results are input to the comparator circuit 22. The ratio ($D=P_1/P_2$) between the first power value ($P_1$) and the second power value (P) is then calculated.

A difference ($D_{now}-D_{prev}$) between the current value ($D_{now}$) and the previous value ($D_{prev}$) of the ratio ($D=P_1/P_2$) between the first power value ($P_1$) and the second power value ($P_2$) is then calculated. The calculation of the variation ($D_{now}-D_{prev}$) in the ratio is performed by the comparator circuit 22. The variation ($P_{now}-P_{prev}$) in the ratio is expressed by the absolute value thereof, for example.

The absolute value of the variation ($P_{now}-P_{prev}$) in the ratio is then compared with a predetermined threshold value ($D_{th}$). This comparison is performed by determining whether the absolute value of the variation ($P_{now}-P_{prev}$) in the ratio is larger than the predetermined threshold value ($D_{th}$). The threshold value ($D_{th}$) is the value that defines the allowable range within which the ratio ($D=P_1/P_2$) between the first power value ($P_1$) and the second power value ($P_2$) can be determined not to have varied in a case where a variation in power has been caused by the power amplifier 200, for example.

The power communication device of this embodiment includes the power amplifier 200, to perform TPC (Transmission Power Control) to control transmission power in accordance with variations in the communication state. Therefore, it is preferable to determine whether a variation in the value of power detected by the power detector 16 is caused by impedance mismatching due to a state change or an environmental change, or is caused by the power amplifier 200 (a gain change).

In this embodiment, when the absolute value of the ratio ($D=P_1/P_2$) between the first power value ($P_1$) and the second power value ($P_2$) is equal to or smaller than the predetermined threshold value ($D_{th}$), for example, it is determined that the variation in the ratio is within the margin of error, and no variation has been caused by a state change or an environmental change, as shown in FIG. 14. In a case where it is determined no variation in power has been caused by a state change or an environmental change, the control circuit 20 remains in a stopped state, the current value ($D_{now}$) in the ratio is assigned to the previous value ($D_{prev}$), and the comparator circuit 22 continues to perform determination.

In a case where the absolute value of the ratio ($D=P_1/P_2$) between the first power value ($P_1$) and the second power value ($P_2$) is larger than the predetermined threshold value ($D_{th}$), on the other hand, it is determined that a variation in the ratio has been caused by a state change or an environmental change. In this case, the control circuit 20 is activated.

The control circuit 20 is activated by an activation signal that is output from the starter circuit 24 to the control circuit 20 based on a result of determination performed by the comparator circuit 22. The control circuit 20 controls the variable impedance matching circuit 12, and performs an impedance matching operation according to the flowchart shown in FIG. 2, for example.

According to this embodiment, the probe 14 that serves as a detector is located near the top end of the antenna 10, which is an open end, so that the impedance matching state of the antenna 10 can be evaluated based on the magnitude of power detected by the probe 14. Accordingly, highly-accurate impedance matching can be realized in a wide radio-frequency band with a simple, small-sized structure, regardless of the frequency used by the antenna device 100. The only loss caused by impedance matching in the antenna device 100 of this embodiment is the power detected by the probe 14. Accordingly, an antenna device with extremely low loss can be realized. Furthermore, with the control circuit 20 controlling the variable impedance matching circuit 12, impedance matching can be automatically performed.

Also, according to this embodiment, the first power detector 30, the second power detector 32, the comparator circuit 22, and the starter circuit 24 are provided, so that a variation in power caused by the power amplifier 200 because of TPC control can be distinguished from a variation in power due to impedance mismatching caused by a state change or an environmental change. Furthermore, in a case where it is determined that the variation in power has not been caused by impedance mismatching, the variable impedance matching circuit 12 is not driven, so that unnecessary circuit operations can be avoided. Accordingly, power consumption can be reduced, for example. Also, as the cause of a variation in power is determined by using the ratio between power values detected by the two detectors of the first power detector 30 and the second power detector 32, highly accurate determination can be performed.

(Eighth Embodiment)

An antenna device of this embodiment is the same as that of the seventh embodiment, except that the first and second power detectors 30 and 32 are logarithmic peak power detectors, the comparator circuit 22 includes a subtraction circuit and performs a subtraction process on the first power value ($P_1$) and the second power value ($P_2$). Therefore, the same aspects as those of the seventh embodiment will not be described below.

A logarithmic peak power detector is a power detector that outputs the logarithm of a value of detected power. Therefore, in this embodiment, the first power value ($P_1$) and the second power value ($P_2$) that are output from the first and second power detectors 30 and 32 are the logarithms of measured power.

Figure 15:
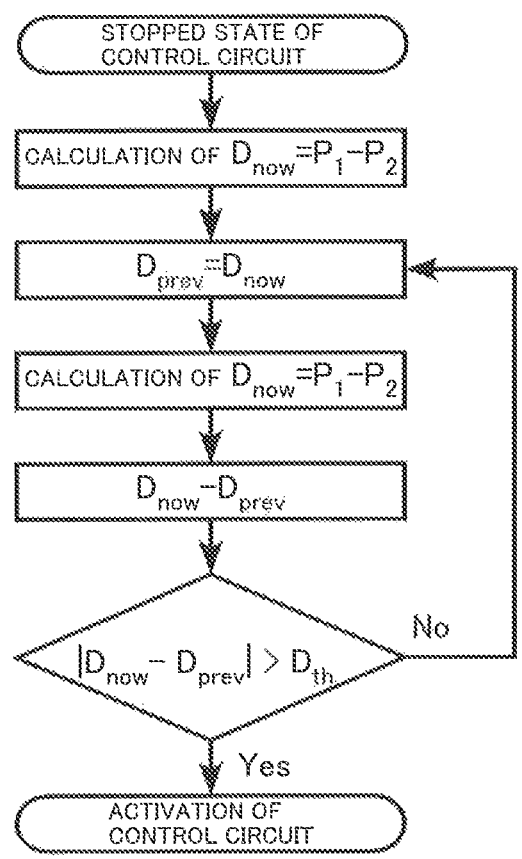
FIG. 15 is a flowchart showing a control circuit activating operation of an eighth embodiment.

FIG. 15 is a flowchart showing an example of a control circuit activating operation according to this embodiment.

In this embodiment, a ratio (D) between power detected by the first power detector 30 and power detected by the second power detector 32 can be calculated as a difference between the first power value ($P_1$) and the second power value ($P_2$). This is because the first power value ($P_1$) and the second power value ($P_2$) are the logarithms of the detected power, and a division process to be performed on the detected power turns into a subtraction process. This subtraction process is performed by the subtraction circuit in the comparator circuit 22, for example. The other aspects in the flow are the same as those of the seventh embodiment.

According to this embodiment, a ratio (D) between power detected by the first power detector 30 and power detected by the second power detector 32 can be calculated by a subtraction process. Accordingly, the load on the software of the comparator circuit 22 can be reduced, for example. Also, the hardware configuration of the comparator circuit 22 can be simplified, for example.

(Ninth Embodiment)

An antenna device of this embodiment includes: an antenna; a variable impedance matching circuit that is connected to the antenna; a probe that receives power from the antenna; a first power detector that is connected to the probe; a control circuit that is connected to the first power detector, and controls the variable impedance matching circuit based on a value of power measured by the first power detector; a second power detector that is connected to the opposite side of the variable impedance matching circuit from the antenna; a comparator circuit that compares a first power value measured by the first power detector with a second power value measured by the second power detector; and a starter circuit that activates the control circuit based on a result of the comparison performed by the comparator circuit. The antenna device further includes an arithmetic circuit that adds a predetermined bias value to the first power value or subtracts the predetermined bias value from the first power value based on the result of the comparison performed by the comparator circuit.

A wireless communication apparatus of this embodiment includes: the antenna device; a radio that is connected to the opposite side of the variable impedance matching circuit from the antenna; and a power amplifier that is connected between the variable impedance matching circuit and the radio.

The antenna device of this embodiment is basically the same as that of the seventh embodiment, except for further including first and second arithmetic circuits. Therefore, the same aspects as those of the seventh embodiment will not be described below.

Figure 16:
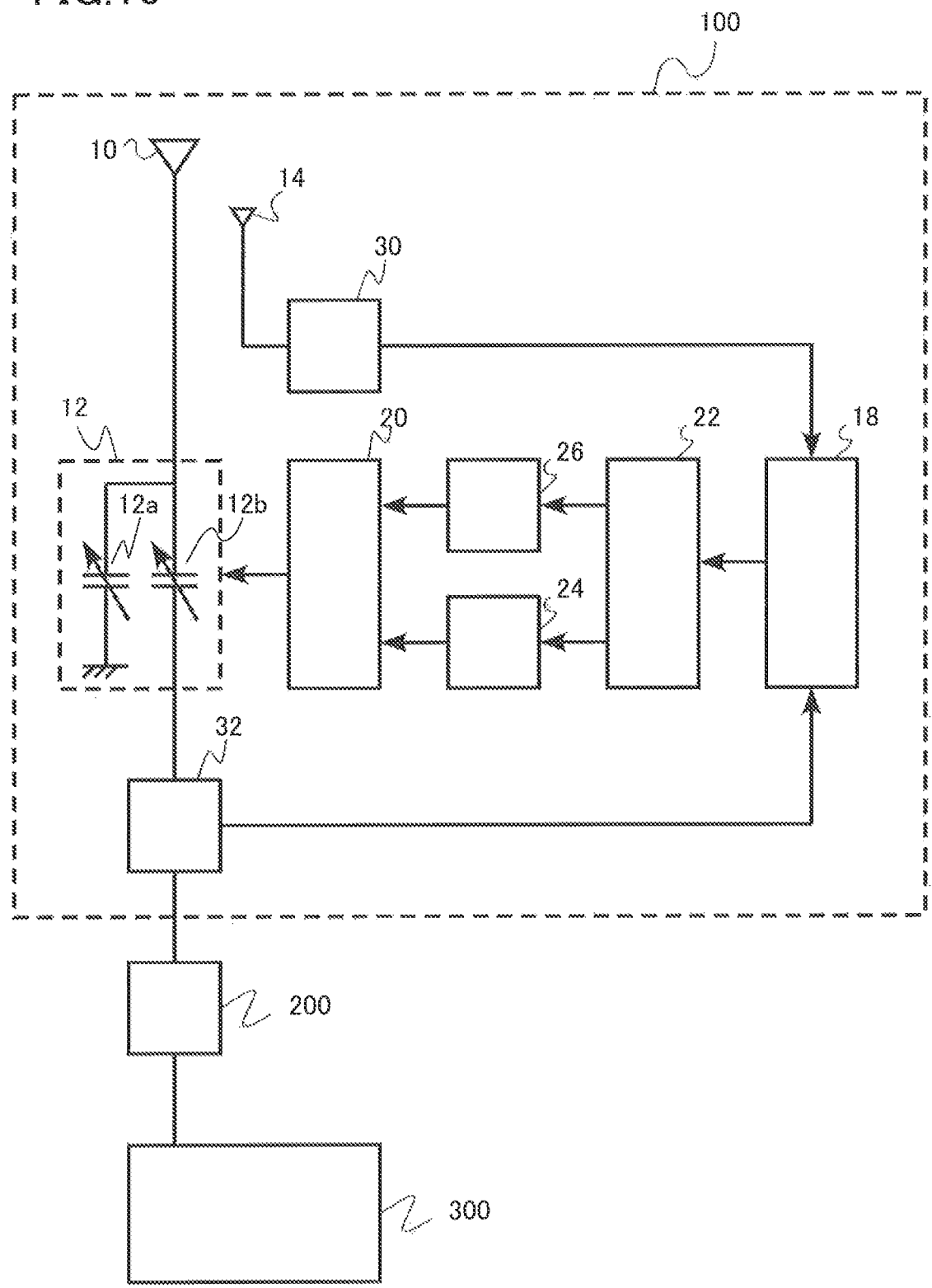
FIG. 16 is a schematic diagram showing the structures of an antenna device and a wireless communication apparatus of a ninth embodiment.

FIG. 16 is a schematic diagram showing the structures of the antenna device and the wireless communication apparatus of this embodiment. The wireless communication apparatus of this embodiment includes an antenna device 100, a power amplifier 200, and a radio 300. The radio 300 is a transmitter, for example. In this manner, the antenna device 100, the power amplifier 200 connected to the antenna device 100, and the radio 300 constitute the wireless communication apparatus. The wireless communication apparatus is a portable telephone device, for example.

The antenna device 100 includes an antenna 10, a variable impedance matching circuit 12, a probe 14, a first power detector 30, a second power detector 32, a first arithmetic circuit 18, a control circuit 20 a comparator circuit 22, a second arithmetic circuit 26, and a starter circuit 24.

The first arithmetic circuit 18 is connected to the first power detector 30 and the second power detector 32. The first arithmetic circuit 18 performs an arithmetic operation on a first power value detected by the first power detector 30 and a second power value detected by the second power detector 32. The first arithmetic circuit 18 is realized by a combination of hardware such as a microcomputer and software stored in a semiconductor memory, for example.

The second arithmetic circuit 26 is connected between the comparator circuit 22 and the control circuit 20. The second arithmetic circuit 26 adds a predetermined bias value to or subtracts the predetermined bias value from the first power value detected by the first power detector 30 based on a result of a comparison performed by the comparator circuit 22. The second arithmetic circuit 26 is realized by a combination of hardware such as a microcomputer and software stored in a semiconductor memory, for example.

For example, in a case where it can be determined that a variation in detected power has been caused by a gain change, the predetermined bias value is add to or subtracted from the first power value so as to offset the variation caused by a gain change. This bias value is a variation in the second power value, or a variation in power increased or decreased by the power amplifier 200, for example. The control circuit 20 controls the variable impedance matching circuit 12 based on the variation having the predetermined bias value added thereto or subtracted therefrom.

The functions and effects of the antenna device and the wireless communication apparatus of this embodiment are now described below.

Figure 17:
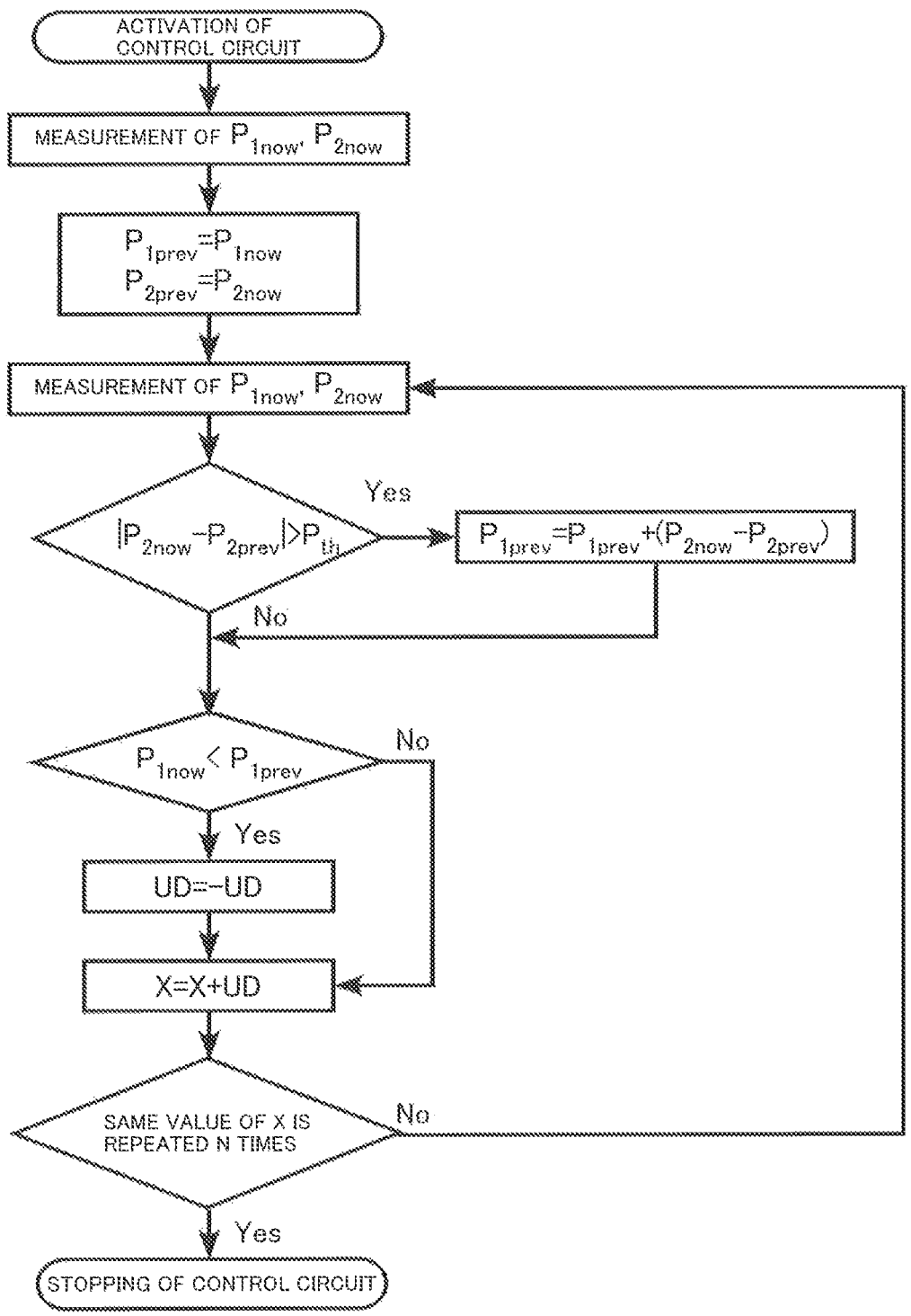
FIG. 17 is a flowchart showing an impedance matching operation of the ninth embodiment.

FIG. 17 is a flowchart showing an example of an impedance matching operation according to this embodiment.

The control circuit 20 is first activated, and an automatic impedance matching operation by the variable impedance matching circuit 12 is started. The current value ($P_{1now}$) of the first power value is measured by the first power detector 30, and the current value ($P_{2now}$) of the second power value is measured by the second power detector 32. The measurement results are input to the first arithmetic circuit 18. The current value ($P_{1now}$) of the first power value is then assigned to the previous value ($P_{1prev}$) of the first power value. Also, the current value ($P_{2now}$) of the second power value is assigned to the previous value ($P_{2prev}$) of the second power value. The current value ($P_{1now}$) of the first power value is again measured by the first power detector 30, and the current value ($P_{2now}$) of the second power value is again measured by the second power detector 32. The measurement results are input to the first arithmetic circuit 18.

The absolute value of a difference ($P_{2now}-P_{2prev}$) between the current value ($P_{2now}$) of the second power value and the previous value ($P_{2prev}$) of the second power value, or a variation in the second power value, is compared with a predetermined threshold value ($P_{th}$). This comparison is performed by the comparator circuit 22.

A case where the absolute value of the difference ($P_{2now}-P_{2prev}$) in the second power value is larger than the predetermined threshold value ($P_{th}$) is a case where power is increased by the power amplifier 200 during an impedance matching operation, for example. In this case, an increase/decrease in the value of power caused by a state change or an environmental change and an increase/decrease in the value of power caused by a gain change are included in the variation in the first power value. Therefore, so as to efficiently perform impedance matching while avoiding an incorrect operation, the increase/decrease in the second power value caused by a gain change is preferably compensated by a bias value.

In view of the above, the difference ($P_{2now}-P_{2prev}$) in the second power value is added as the increase/decrease in the power value caused by a gain change, to the previous value ($P_{1prev}$) of the first power value.

In a case where the absolute value of the difference ($P_{2now}-P_{2prev}$) is not larger than the predetermined threshold value ($P_{th}$), the variation in the first power value does not include a variation caused by a gain change, and therefore, the addition of the bias value is not performed.

The addition or subtraction of the bias value is performed by the second arithmetic circuit 26.

The current value ($P_{1now}$) of the first power value is then compared with the previous value ($P_{1prev}$), to determine which value is larger. In this manner, an increase/decrease in the power released from the antenna 10 is determined.

It the current value ($P_{1now}$) is larger than the previous value ($P_{1prev}$), "X+UD" is assigned to X. If the current value ($P_{1now}$) is smaller than the previous value ($P_{1prev}$), −UD with the opposite sign is assigned to UD, and "X+UD" is then assigned to X.

Here, X represents the instruction parameter for indicating the impedance value of the variable impedance elements in the variable impedance matching circuit 12. UD represents the minimum unit of the instruction parameter. As X is changed with UD as the minimum unit, the impedance of the variable impedance matching circuit 12 varies, and the power to be emitted from the antenna 10 also varies with the state of impedance matching. The instruction parameter is the reactance value of the variable capacitances 12a and 12b, for example.

If the current value ($P_{1now}$) is larger than the previous value ($P_{1prev}$), "X+UD" is assigned to X as described above, so as to maintain the direction of change in X in one direction. With this, the power to be emitted from the antenna 10 increases. If the current value ($P_{1now}$) is smaller than the previous value ($P_{1prev}$), on the other hand, −UD with the opposite sign is assigned to UD, and "X+UD" is then assigned to X, so as to switch the direction of change in X to the opposite direction. With this, the value of X varies in the opposite direction, and the power to be emitted from the antenna 10 increases. In this manner, the variable impedance matching circuit 12 is controlled so as to maximize the power to be emitted from the antenna 10.

In a case where the same value of X is repeated N times (N being a predetermined natural number), it is determined that the power to be emitted from the antenna 10 is maximized, and impedance matching is achieved. Accordingly, the operation of the control circuit 20 is stopped. The number of times the direction of change in impedance is switched is measured by counting the number of times the same value of X is repeated.

In this embodiment, the minimum variation width of the value of power at the time when the control circuit 20 controls the variable impedance matching circuit 12 is preferably smaller than the minimum gain variable width of the power amplifier 200. That is, the variation width of the value of power at the time when the instruction parameter X is changed by UD, which is the minimum unit thereof, is preferably smaller than the minimum gain variable width $\Delta G$ (dB) of the power amplifier 200. With this arrangement, a check can be easily made to determine whether a variation in the value of power includes a variation caused by a gain change.

The operation related to activation of the control circuit 20 is the same as that of the seventh embodiment.

According to this embodiment, TPC is performed during an impedance matching operation. Even if an increase or a decrease in power is caused by the power amplifier 200, the comparator circuit 22 determines whether there is a variation in power caused by the gain change. Furthermore, a variation in the first power value caused by a gain change is compensated by adding an appropriate bias value to the detected first power value or subtracting the appropriate bias value from the detected first power value. Accordingly, an impedance matching operation can be performed based on variations in the first power value caused by state changes or environmental changes. Thus, unnecessary operations are avoided, and automatic impedance matching can be efficiently performed. Also, incorrect operations in automatic impedance matching can be prevented.

(Tenth Embodiment)

An antenna device of this embodiment is basically the same as that of the seventh embodiment, except for further including a storage element that stores a relationship between the radio frequency to be used in the antenna device and the optimum impedance state of the variable impedance matching circuit. Therefore, the same aspects as those of the seventh embodiment will not be described below.

A wireless communication apparatus of this embodiment includes: the antenna device; a radio that is connected to the opposite side of the variable impedance matching circuit from the antenna; and a power amplifier that is connected between the variable impedance matching circuit and the radio.

Figure 18:
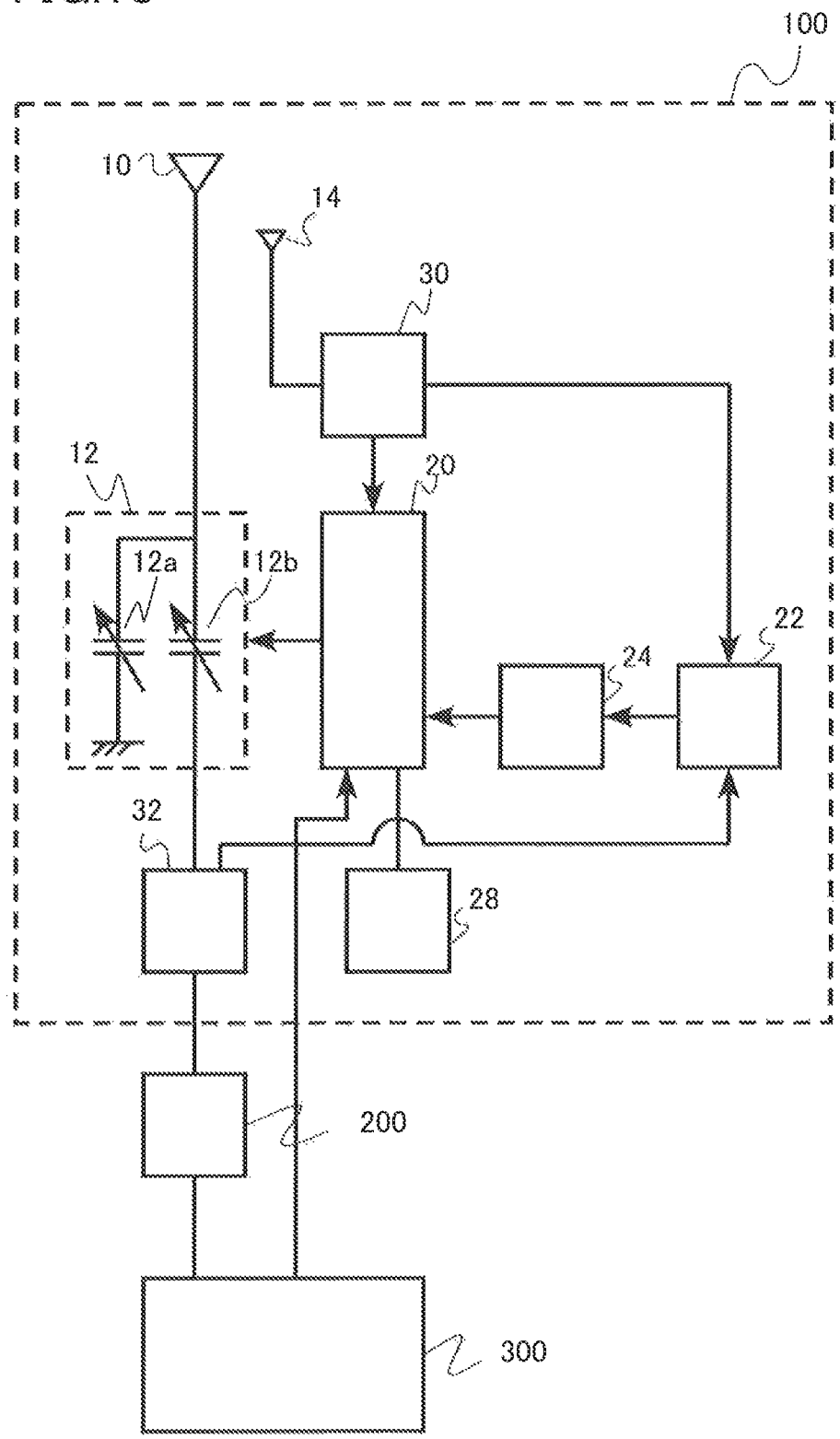
FIG. 18 is a schematic diagram showing the structures of an antenna device and a wireless communication apparatus of a tenth embodiment.

FIG. 18 is a schematic diagram showing the structures of the antenna device and the wireless communication apparatus of this embodiment. The wireless communication apparatus of this embodiment includes an antenna device 100, a power amplifier 200, and a radio 300.

The antenna device 100 includes a storage element 28. The storage element 28 stores the relationship between the radio frequency to be used in the antenna device 100 and the optimum impedance state of the variable impedance matching circuit 12. Specifically, the storage element 28 stores a table that shows the relationship between a radio frequency and the instruction parameter X for giving the variable impedance matching circuit 12 the optimum impedance value to achieve impedance matching at the radio frequency.

The storage element 28 is a semiconductor memory, for example.

The radio frequency to be used in the antenna device 100 is transmitted as a signal from the radio 300 to the control circuit 20, for example. The control circuit 20 acquires, from the storage element 28, the instruction parameter X for realizing the optimum impedance state for the radio frequency transmitted from the radio 300. Based on the instruction parameter X, the control circuit 20 controls the variable impedance matching circuit 12.

In a case where the wireless communication apparatus uses more than one radio-frequency band, for example, the optimum instruction parameter X varies with the respective radio-frequency bands. Even in the same frequency band, the optimum instruction parameter X may vary with the respective radio frequencies in the band.

According to this embodiment, the optimum instruction parameter X for the radio frequency to be used at the time of activation of the control circuit 20 can be set as the initial value, for example, and impedance matching is then performed. In a case where the radio frequency being used varies during a communication, for example, the instruction parameter X is switched to the optimum instruction parameter X for the radio frequency being used, so that impedance matching can be performed with this instruction parameter X serving as the initial value. Accordingly, quick impedance matching can be performed. Furthermore, unnecessary circuit operations for impedance matching are avoided, and accordingly, power consumption can be reduced.

(Eleventh Embodiment)

An antenna device of this embodiment is an embodiment in which the shape of the antenna and the positional relationship between the antenna and the probe according to the sixth embodiment are applied to the seventh embodiment. Therefore, the same aspects as those of the sixth and seventh embodiments will not be described below.

In this embodiment, the antenna has a feeding point and end portions that are separated from the feeding point, and the distance between an end portion of the antenna and the edge of the probe is equal to or shorter than one eighth of the wavelength corresponding to the maximum radio frequency to be used in the antenna device. Accordingly, the accuracy in impedance matching is increased.

(Twelfth Embodiment)

An antenna device of this embodiment includes: an antenna; a variable impedance matching circuit that is connected to the antenna; a probe that receives power from the antenna; a first power detector that is connected to the probe; a control circuit that is connected to the first power detector, and controls the variable impedance matching circuit based on a value of power measured by the first power detector; a second power detector that is connected to the opposite side of the variable impedance matching circuit from the antenna; and a comparator circuit that compares a first power value measured by the first power detector with a second power value measured by the second power detector. The antenna device further includes an arithmetic circuit that adds a predetermined bias value to the first power value or subtracts the predetermined bias value from the first power value based on a result of the comparison performed by the comparator circuit.

A wireless communication apparatus of this embodiment includes: the antenna device; a radio that is connected to the opposite side of the variable impedance matching circuit from the antenna; and a power amplifier that is connected between the variable impedance matching circuit and the radio.

The antenna device of this embodiment is basically the same as that of the ninth embodiment, except for not including a starter circuit. Therefore, the same aspects as those of the ninth embodiment will not be described below.

Figure 19:
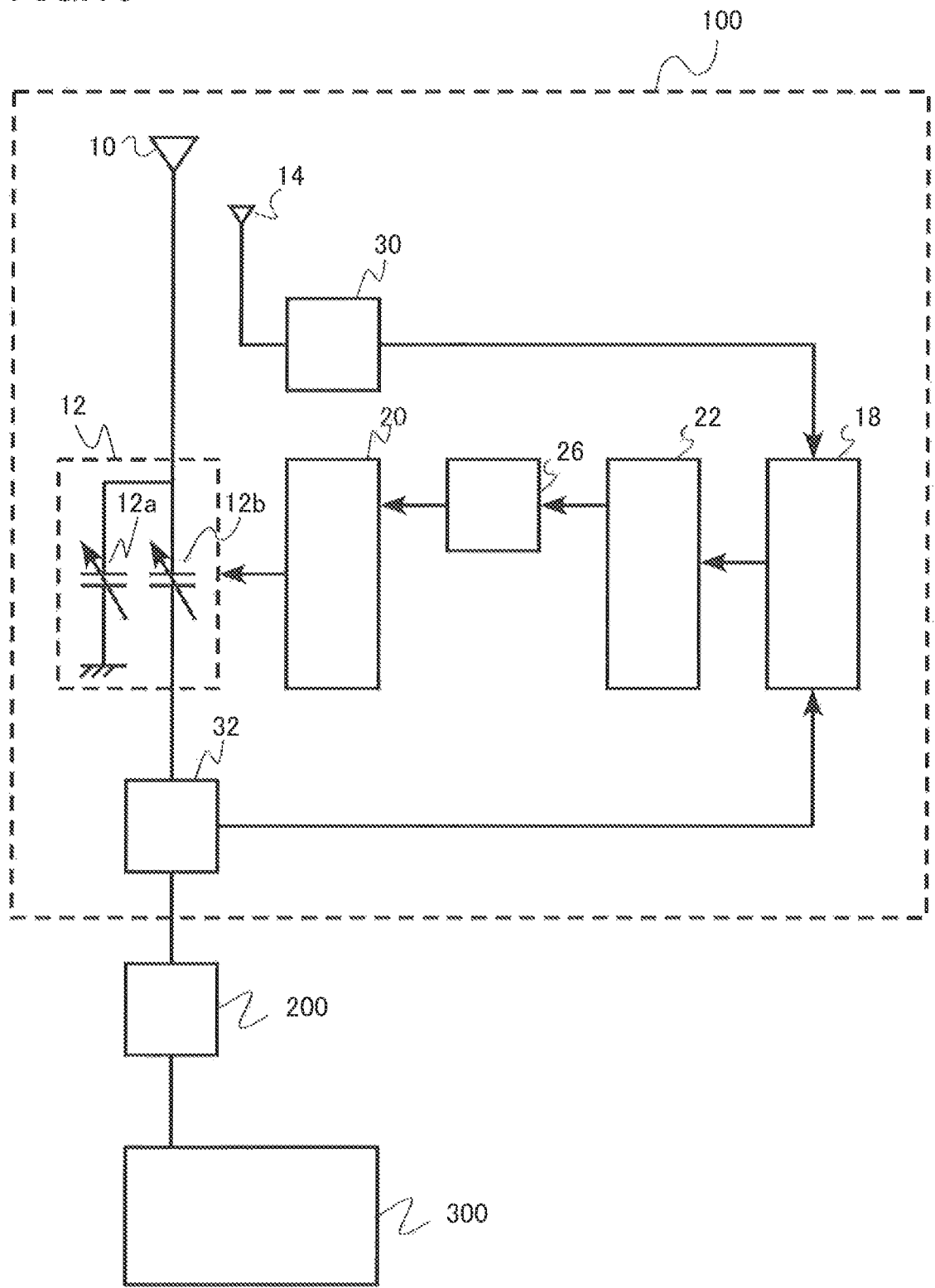
FIG. 19 is a schematic diagram showing the structures of an antenna device and a wireless communication apparatus of a twelfth embodiment.

FIG. 19 is a schematic diagram showing the structures of the antenna device and the wireless communication apparatus of this embodiment. The wireless communication apparatus of this embodiment includes an antenna device 100, a power amplifier 200, and a radio 300. The radio 300 is a transmitter, for example. In this manner, the antenna device 100, the power amplifier 200 connected to the antenna device 100, and the radio 300 constitute the wireless communication apparatus. The wireless communication apparatus is a portable telephone device, for example.

The antenna device 100 includes an antenna 10, a variable impedance matching circuit 12, a probe 14, a first power detector 30, a second power detector 32, a first arithmetic circuit 16, a control circuit 20, a comparator circuit 22, and a second arithmetic circuit 26.

In this embodiment, the control circuit 20 may be constantly in an activated state, for example.

According to this embodiment, an impedance matching operation can be performed based on variations in the first power value caused by state changes or environmental changes, as in the ninth embodiment. Accordingly, unnecessary operations are avoided, and impedance matching can be efficiently performed. Also, incorrect operations in impedance matching can be prevented.

(Thirteenth Embodiment)

An antenna device of this embodiment includes: an antenna; a variable impedance matching circuit that is connected to the antenna; a probe that receives power from the antenna; a power detector that is connected to the probe; a control circuit that is connected to the power detector, and controls the variable impedance matching circuit based on a value of power measured by the power detector; and a starter circuit that activates the control circuit based on information about amplification of the power to be input to the variable impedance matching circuit.

A wireless communication apparatus of this embodiment includes: the antenna device; a radio that is connected to the opposite side of the variable impedance matching circuit from the antenna; and a power amplifier that is connected between the variable impedance matching circuit and the radio. The radio 300 includes a TPC control circuit 300a that transmits a TPC control signal to the power amplifier 200 and the starter circuit 24.

Figure 20:
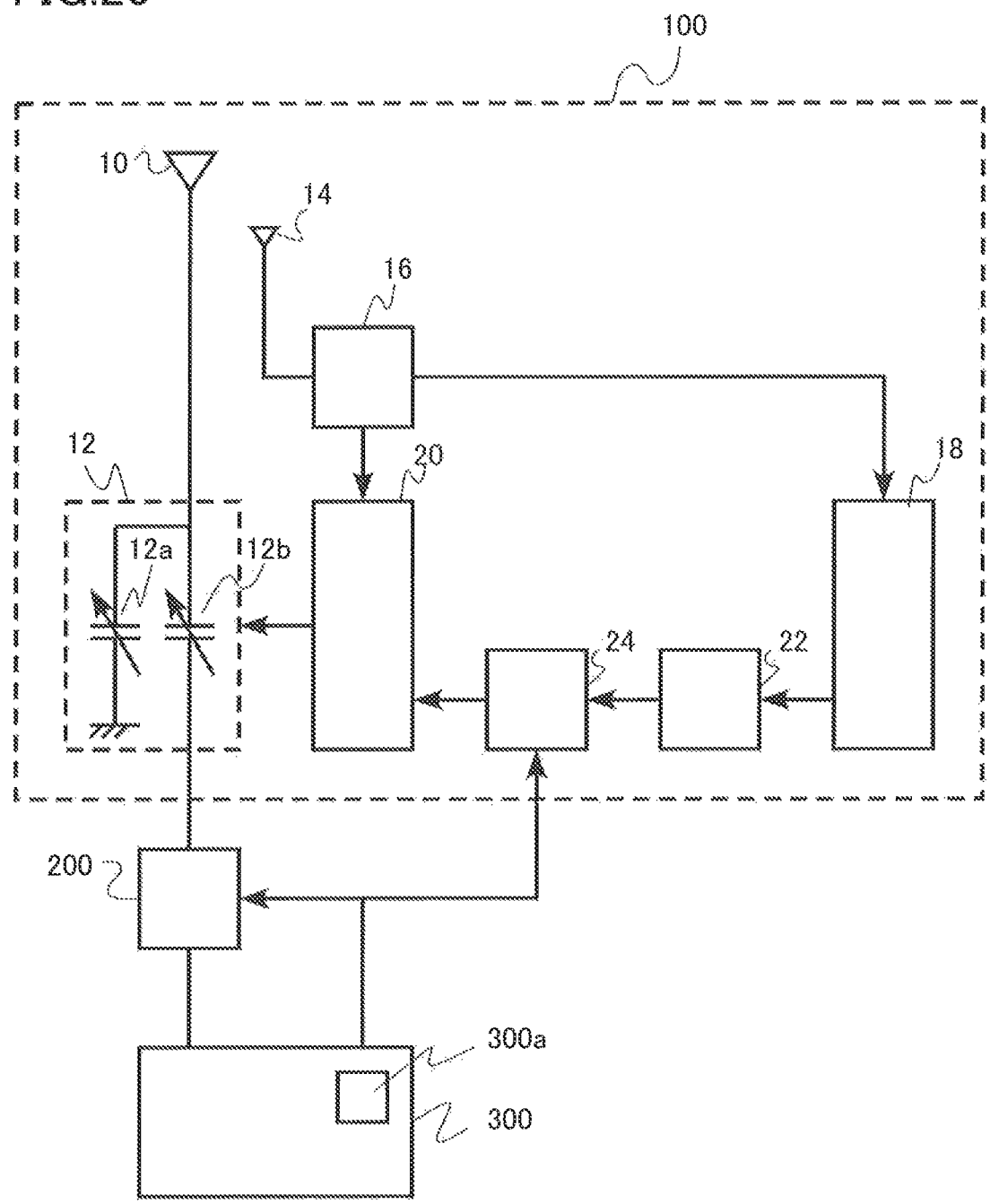
FIG. 20 is a schematic diagram showing the structures of an antenna device and a wireless communication apparatus of a thirteenth embodiment.

FIG. 20 is a schematic diagram showing the structures of the antenna device and the wireless communication apparatus of this embodiment. The wireless communication apparatus of this embodiment includes an antenna device 100, a power amplifier 200, and a radio 300. The radio 300 is a transmitter, for example. In this manner, the antenna device 100, the power amplifier 200 connected to the antenna device 100, and the radio 300 constitute the wireless communication apparatus. The wireless communication apparatus is a portable telephone device, for example.

The antenna device 100 includes an antenna 10, a variable impedance matching circuit 12, a probe 14, a power detector 16, a first arithmetic circuit 18, a control circuit 20 a comparator circuit 22, and a starter circuit 24.

In this embodiment, the radio 300 includes a TPC control circuit 300a that transmits a TPC control signal to the power amplifier 200 and the starter circuit 24. The TPC control circuit 300a is realized by a combination of hardware such as a microcomputer and software stored in a semiconductor memory, for example. Alternatively, the TPC control circuit 300a may be formed with hardware such as an analog circuit or a digital circuit.

This embodiment is the same as the first embodiment, except for operations of the comparator circuit 22 and the starter circuit 24, and the configuration for realizing those operations. Therefore, the same aspects as those of the first embodiment will not be described below.

The power amplifier 200 changes transmission power in accordance with the TPC control signal from the TPC control circuit 300a. The TPC control signal is also transmitted to the starter circuit 24. The TPC control signal contains information about amplification of the power to be input to the variable impedance matching circuit 12.

The comparator circuit 22 is connected between the first arithmetic circuit 18 and the control circuit 20. The comparator circuit 22 compares a variation in the value of power of the antenna 10 calculated by the first arithmetic circuit 18 with a predetermined threshold value ($\epsilon$). This comparison is performed so as to determine whether the variation in power has such a magnitude that requires an impedance matching operation.

The starter circuit 24 is connected between the comparator circuit 22 and the control circuit 20. The starter circuit 24 activates the control circuit 20 based on a result of the comparison performed by the comparator circuit 22 and the TPC control signal.

In a case where the comparator circuit 22 determines a variation in the value of power to be equal to or larger than the threshold value, and the TPC control signal does not order amplification by the power amplifier 200, for example, the starter circuit 24 determines that mismatching has been caused by a state change or an environmental change. The starter circuit 24 then activates the control circuit 20, and an impedance matching operation is started.

In a case where the comparator circuit 22 determines a variation in the value of power to be smaller than the threshold value, or where the TPC control signal orders amplification by the power amplifier 200, for example, the starter circuit 24 determines that the variation in the value of power is small or has been caused by a gain change. In this case, the starter circuit 24 does not activate the control circuit 20, and an impedance matching operation is not performed.

According to this embodiment, the starter circuit 24 determines whether a variation in the value of rower has been caused by a gain change based on the TPC control signal from the TPC control circuit 300a. Accordingly, necessity/unnecessity of automatic impedance matching can be determined with a higher degree of accuracy. Accordingly, more stable automatic impedance matching is realized.

(Fourteenth Embodiment)

An antenna device of this embodiment includes: an antenna; a variable impedance matching circuit that is connected to the antenna; a probe that receives power from the antenna; a power detector that is connected to the probe; a control circuit that is connected to the power detector, and controls the variable impedance matching circuit based on a value of power measured by the power detector; a starter circuit that activates the control circuit based on information about amplification of the power to be input to the variable impedance matching circuit; and an arithmetic circuit that adds a predetermined bias value to a variation in the value of power or subtracts the predetermined bias value from the variation in the value of power based on the information about amplification of the power to be input to the variable impedance matching circuit.

A wireless communication apparatus of this embodiment includes: the antenna device; a radio that is connected to the opposite side of the variable impedance matching circuit from the antenna; and a power amplifier that is connected between the variable impedance matching circuit and the radio. The radio 300 includes a TPC control circuit 300a that transmits a TPC control signal to the power amplifier 200 and the starter circuit 24.

Figure 21:
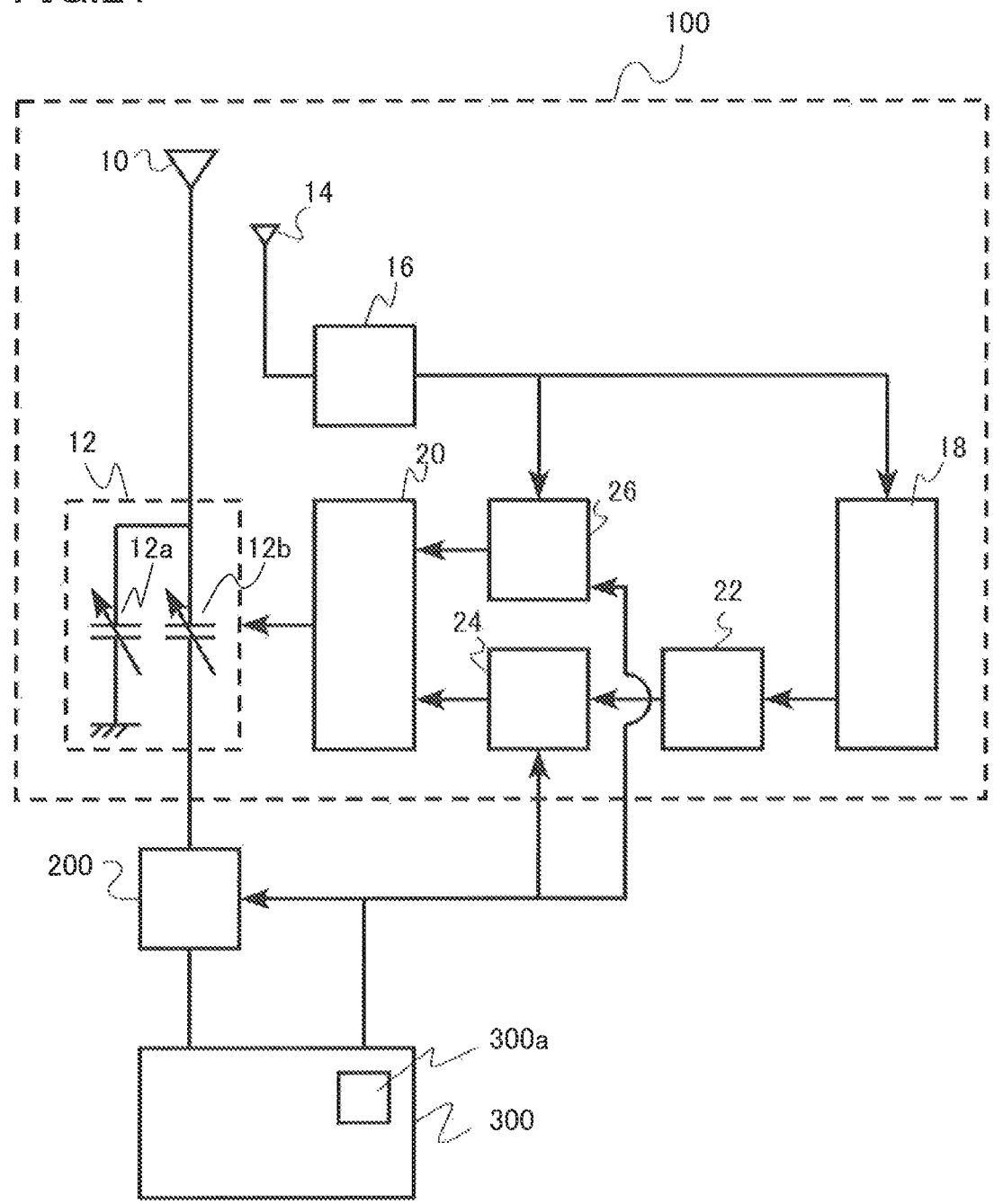
FIG. 21 is a schematic diagram showing the structures of an antenna device and a wireless communication apparatus of a fourteenth embodiment.

FIG. 21 is a schematic diagram showing the structures of the antenna device and the wireless communication apparatus of this embodiment. The wireless communication apparatus of this embodiment includes an antenna device 100, a power amplifier 200, and a radio 300. The radio 300 is a transmitter, for example. In this manner, the antenna device 100, the power amplifier 200 connected to the antenna device 100, and the radio 300 constitute the wireless communication apparatus. The wireless communication apparatus is a portable telephone device, for example.

The antenna device 100 includes an antenna 10, a variable impedance matching circuit 12, a probe 14, a power detector 16, a first arithmetic circuit 18, a control circuit 20, a comparator circuit 22, a starter circuit 24, and a second arithmetic circuit 26.

In this embodiment, the radio 300 includes a TPC control circuit 300a that transmits a TPC control signal to the power amplifier 200 and the starter circuit 24. The TPC control circuit 300a is realized by a combination of hardware such as a microcomputer and software stored in a semiconductor memory, for example. Alternatively, the TPC control circuit 300a may be formed with hardware such as an analog circuit or a digital circuit.

This embodiment is the same as the second embodiment, except for operations of the comparator circuit 22, the starter circuit 24, and the second arithmetic circuit 26, and the configuration for realizing those operations. Therefore, the same aspects as those of the second embodiment will not be described below.

The power amplifier 200 changes transmission power in accordance with the TPC control signal from the TPC control circuit 300a. The TPC control signal is also transmitted to the starter circuit 24 and the second arithmetic circuit 26. The TPC control signal contains information about amplification of the power to be input to the variable impedance matching circuit 12.

The comparator circuit 22 is connected between the first arithmetic circuit 18 and the control circuit 20. The comparator circuit 22 compares a variation in the value of power of the antenna 10 calculated by the first arithmetic circuit 18 with a predetermined threshold value ($\epsilon$). This comparison is performed so as to determine whether the variation in power has such a magnitude that requires an impedance matching operation.

The starter circuit 24 is connected between the comparator circuit 22 and the control circuit 20. The starter circuit 24 activates the control circuit 20 based on a result of the comparison performed by the comparator circuit 22 and the TPC control signal.

In a case where the comparator circuit 22 determines a variation in the value of power to be equal to or larger than the threshold value, and the TPC control signal does not order amplification by the power amplifier 200, for example, the starter circuit 24 determines that mismatching has been caused by a state change or an environmental change. The starter circuit 24 then activates the control circuit 20, and an impedance matching operation is started.

In a case where the comparator circuit 22 determines a variation in the value of power to be smaller than the threshold value, or where the TPC control signal orders amplification by the power amplifier 200, for example, the starter circuit 24 determines that the variation in the value of power is small or has been caused by a gain change. In this case, the starter circuit 24 does not activate the control circuit 20, and an impedance matching operation is not performed.

The second arithmetic circuit 26 is connected between the power detector 16 and the control circuit 20, for example. The second arithmetic circuit 26 adds a predetermined bias value to or subtracts the predetermined bias value from a variation in the value of power detected by the power detector 16 based on the TPC control signal. The second arithmetic circuit 26 is realized by a combination of hardware such as a microcomputer and software stored in a semiconductor memory, for example.

In a case where the TEC control signal orders amplification by the power amplifier 200, for example, the predetermined bias value is added to or subtracted from the value of power, so as to offset a variation caused by the gain change. This bias value is the minimum gain variable width of the power amplifier 200, for example. The control circuit 20 controls the variable impedance matching circuit 12 based on the variation having the predetermined bias value added thereto or subtracted therefrom.

In a case where the TPC control signal does not order amplification by the power amplifier 200, on the other hand, the second arithmetic circuit 26 does not perform the addition or the subtraction of the bias value.

According to this embodiment, the starter circuit 24 determines whether a variation in the value of power has been caused by a gain change based on the TPC control signal from the TPC control circuit 300a. Accordingly, necessity/unnecessity of automatic impedance matching can be determined with a higher degree of accuracy. Accordingly, more stable automatic impedance matching is realized.

According to this embodiment, TPC is performed during an impedance matching operation. Even if an increase or a decrease in power is caused by the power amplifier 200, the second arithmetic circuit 26 accurately determines whether there is a variation in power caused by the gain change based on the TPC control signal from the TPC control circuit 300a. Furthermore, the variation in the value of power caused by the gain change is compensated by adding an appropriate bias value to the detected value of power or subtracting the appropriate bias value from the detected value of power. Accordingly, an impedance matching operation can be performed based on variations in the value of power caused by state changes or environmental changes. Thus, unnecessary operations are avoided, and automatic impedance matching can be efficiently performed. Also, incorrect operations in automatic impedance matching can be prevented.

In this embodiment, it is possible to directly determine, from the TPC control signal, whether there is a variation in the value of power caused by a gain change. Accordingly, switching between existence and nonexistence of a gain change can be easily realized without any particular restrictions on the magnitude relationship between the minimum variation width of the value of power at the time when the control circuit 20 controls the variable impedance matching circuit 12, and the minimum gain variable width of the power amplifier 200. Accordingly, the degree of freedom in designing the wireless communication apparatus becomes higher.

While certain embodiments have been described, these embodiments have been presented by way of example only, and are not intended to limit the scope of the inventions. Indeed, the antenna device and the wireless communication apparatus described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An antenna device comprising:
   an antenna;
   a variable impedance matching circuit connected to the antenna;
   a probe receiving power from the antenna;
   a power detector connected to the probe;
   a control circuit controlling the variable impedance matching circuit based on a power value measured by the power detector;
   a first arithmetic circuit calculating a variation in the power value measured by the power detector;
   a comparator circuit comparing the variation with a predetermined numerical value range;
   a starter circuit activating the control circuit based on a result of the comparison performed by the comparator circuit; and
   a second arithmetic circuit adding a predetermined bias value to the power value or subtracting the predetermined bias value from the power value based on the result of the comparison performed by the comparator circuit.

2. The device according to claim 1, wherein,
   when an increasing/decreasing direction of the power value measured by the power detector remains the same, the control circuit changes an impedance of the variable impedance matching circuit in one direction,
   when the increasing/decreasing direction of the power value measured by the power detector changes, the control circuit changes the impedance of the variable impedance matching circuit in the opposite direction of the one direction, and,
   after switching of the direction of change in the impedance is repeated a predetermined number of times, operation of the control circuit is stopped.

3. The device according to claim 1, further comprising
   a storage element storing a relationship between a radio frequency to be used in the antenna device and an optimum impedance state of the variable impedance matching circuit.

4. The device according to claim 1, wherein
   the antenna has a feeding point and an end portion separated from the feeding point, and
   a distance between the end portion of the antenna and an edge of the probe is equal to or shorter than one eighth of a wavelength corresponding to a maximum radio frequency to be used in the antenna device.

5. The device according to claim 1, wherein
   the comparator circuit compares the variation with the predetermined numerical value range, the first arithmetic circuit repeats the calculation of the variation, and the starter circuit activates the control circuit when the variation matches the predetermined numerical value range for the first time after the variation fails to match the predetermined numerical value range.

6. A wireless communication apparatus comprising:
   an antenna device including: an antenna; a variable impedance matching circuit connected to the antenna; a probe receiving power from the antenna; a power detector connected to the probe; a control circuit controlling the variable impedance matching circuit based on a power value measured by the power detector; a first arithmetic circuit calculating a variation in the power value measured by the power detector; a comparator circuit comparing the variation with a predetermined numerical value range; a starter circuit activating the control circuit based on a result of the comparison performed by the comparator circuit; and a second arithmetic circuit adding a predetermined bias value to the variation or subtracting the predetermined bias value from the variation based on the result of the comparison performed by the comparator circuit;
   a radio connected to the opposite side of the variable impedance matching circuit from the antenna; and
   a power amplifier connected between the variable impedance matching circuit and the radio.

7. The apparatus according to claim 6, wherein a minimum variation width of the power value at a time when the control circuit controls the variable impedance matching circuit is smaller than a minimum gain variable width of the power amplifier.

8. An antenna device comprising:
   an antenna;
   a variable impedance matching circuit connected to the antenna;
   a probe receiving power from the antenna;
   a first power detector connected to the probe;
   a control circuit controlling the variable impedance matching circuit based on a power value measured by the first power detector;
   a second power detector connected to the opposite side of the variable impedance matching circuit from the antenna;
   a comparator circuit comparing a first power value measured by the first power detector with a second power value measured by the second power detector; and
   a starter circuit activating the control circuit based on a result of the comparison performed by the comparator circuit.

9. The device according to claim 8, further comprising
   an arithmetic circuit adding a predetermined bias value to the first power value or subtracting the predetermined bias value from the first power value based on the result of the comparison performed by the comparator circuit.

10. The device according to claim 8, wherein the first and second power detectors are logarithmic peak detectors.

11. The device according to claim 8, wherein,
    when an increasing/decreasing direction of the power value measured by the first power detector remains the same, the control circuit changes an impedance of the variable impedance matching circuit in one direction,
    when the increasing/decreasing direction of the power value measured by the first power detector changes, the control circuit changes the impedance of the variable impedance matching circuit in the opposite direction of the one direction, and,
    after switching of the direction of change in the impedance is repeated a predetermined number of times, operation of the control circuit is stopped.

12. The device according to claim 8, further comprising
    a storage element storing a relationship between a radio frequency to be used in the antenna device and an optimum impedance state of the variable impedance matching circuit.

13. The device according to claim 8, wherein
    the antenna has a feeding point and an end portion separated from the feeding point, and a distance between the end portion and an edge of the probe is equal to or shorter than one eighth of a wavelength corresponding to a maximum radio frequency to be used in the antenna device.

14. The device according to claim 10, wherein the comparator circuit includes a subtraction circuit.

15. A wireless communication apparatus comprising:
an antenna device including: an antenna; a variable impedance matching circuit connected to the antenna; a probe receiving power from the antenna; a first power detector connected to the probe; a control circuit controlling the variable impedance matching circuit based on a power value measured by the first power detector; a second power detector connected to the opposite side of the variable impedance matching circuit from the antenna; a comparator circuit comparing a first power value measured by the first power detector with a second power value measured by the second power detector; and a starter circuit activating the control circuit based on a result of the comparison performed by the comparator circuit;
a radio connected to the opposite side of the variable impedance matching circuit from the antenna; and
a power amplifier connected between the variable impedance matching circuit and the radio.

16. The apparatus according to claim 15, wherein the antenna device further includes an arithmetic circuit adding a predetermined bias value to the variation or subtracting the predetermined bias value from the variation based on the result of the comparison performed by the comparator circuit.

17. The apparatus according to claim 15, wherein the first and second power detectors are logarithmic peak detectors.

18. The apparatus according to claim 17, wherein the comparator circuit includes a subtraction circuit.

19. A control device connected to an antenna device receiving power released from an antenna by a probe, the control device comprising:
a control circuit controlling a variable impedance matching circuit connected to the antenna based on a power value received by the probe;
a first arithmetic circuit calculating a variation in the power value received by the probe;
a comparator circuit comparing the variation with a predetermined numerical value range;
a starter circuit activating the control circuit based on a result of the comparison performed by the comparator circuit; and
a second arithmetic circuit adding a predetermined bias value to the power value or subtracting the predetermined bias value from the power value based on the result of the comparison performed by the comparator circuit.

* * * * *